(12) United States Patent
Alon et al.

(10) Patent No.: US 6,642,760 B1
(45) Date of Patent: Nov. 4, 2003

(54) APPARATUS AND METHOD FOR A DIGITAL DELAY LOCKED LOOP

(75) Inventors: Elad Alon, Saratoga, CA (US); Scott Best, Palo Alto, CA (US)

(73) Assignee: Rambus, Inc., Los Altos, CA (US)

( * ) Notice: Subject to any disclaimer, the term of this patent is extended or adjusted under 35 U.S.C. 154(b) by 0 days.

(21) Appl. No.: 10/112,963

(22) Filed: Mar. 29, 2002

(51) Int. Cl.[7] ................................................. H03L 7/06
(52) U.S. Cl. ....................... 327/158; 327/175; 327/276; 327/277
(58) Field of Search .................................. 327/155, 158, 327/161, 173, 174, 175, 176, 269–271, 276, 277, 284, 285

(56) References Cited

U.S. PATENT DOCUMENTS

| | | | |
|---|---|---|---|
| 5,614,855 A | 3/1997 | Lee et al. ..................... | 327/158 |
| 5,939,912 A * | 8/1999 | Rehm ........................... | 327/158 |
| 5,945,862 A | 8/1999 | Donnelly et al. ........... | 327/278 |
| 6,125,157 A | 9/2000 | Donnelly et al. ........... | 375/371 |
| 6,133,773 A | 10/2000 | Garlepp et al. .............. | 327/247 |
| 6,137,328 A | 10/2000 | Sung ............................ | 327/158 |
| 6,147,531 A | 11/2000 | McCall et al. ............... | 327/158 |
| 6,181,178 B1 | 1/2001 | Choi ............................ | 327/175 |
| 6,198,326 B1 | 3/2001 | Choi et al. ................... | 327/263 |
| 6,204,709 B1 | 3/2001 | Searle et al. ................ | 327/231 |
| 6,205,191 B1 | 3/2001 | Portmann et al. ............ | 375/354 |
| 6,229,358 B1 | 5/2001 | Boerstler et al. ............ | 327/116 |
| 6,229,359 B1 | 5/2001 | Chesavage ................... | 327/116 |
| 6,232,812 B1 | 5/2001 | Lee .............................. | 327/277 |
| 6,247,138 B1 | 6/2001 | Tamura et al. ............... | 713/600 |
| 6,262,608 B1 | 7/2001 | O'Hearcain et al. ......... | 327/142 |
| 6,342,796 B2 * | 1/2002 | Jung ............................ | 327/141 |
| 6,396,250 B1 * | 5/2002 | Bridge ......................... | 323/283 |
| 6,480,047 B2 * | 11/2002 | Abdel-Maguid et al. .... | 327/161 |
| 6,486,716 B1 * | 11/2002 | Minami et al. .............. | 327/152 |

OTHER PUBLICATIONS

Jung–Bae Lee, et al., *Digitally–Controlled DLL and I/O Circuits for 500Mb/s/pin×16 DDR SDRAM*, ISSCC 2001, Session 4, High–Speed Digital Interfaces, 4.6, Feb. 5, 2001, 2 pages.

* cited by examiner

Primary Examiner—Timothy P. Callahan
Assistant Examiner—An T. Luu
(74) Attorney, Agent, or Firm—McDonnell Boehnen Hulbert & Berghoff

(57) ABSTRACT

A circuit and method is shown for digital control of delay lines in a delay locked loop (DLL) system. A pair of multiplexors (MUXes) is used to select output taps from a pair of complementary delay lines that delay a reference clock signal in order to lock onto a received clock signal. An output tap from one delay line is used to produce a rising edge in an output clock signal while a corresponding tap in the complementary delay line is used to produce a falling edge in the output signal in order to correct for distortion. The MUXes are controlled based on a phase difference detected between the received clock signal and a feedback clock corresponding to the output clock signal. Another aspect of the present invention provides for generation of a quadrature clock by interpolating between the rising and falling edges selected for the output clock signal. Still another aspect of the present invention provides for selectively disabling unused elements of the delay lines to reduce power consumption.

52 Claims, 13 Drawing Sheets

APPARATUS AND METHOD FOR A DIGITAL DELAY LOCKED LOOP

FIELD OF THE INVENTION

This present invention relates to digital circuits. More specifically, it relates to delay locked loop design.

BACKGROUND OF THE INVENTION

Accurate high-speed clock signals are often used for transmitting and receiving data in high-speed circuits, such as high-speed memory devices or high speed bus channels. However, high speed clock signals often become distorted during transmission and reception. Consequently, high speed circuits, such as dynamic random access memory (DRAM) devices, often recover an externally provided high-speed clock signal by locking an accurate internally generated clock signal to the distorted externally provided clock signal.

A delayed locked loop (DLL) is typically used to delay the internally generated clock signal in order to match the phase of the internally generated clock signal to the phase of some reference clock signal. Typically, a phase-detection circuit in the DLL compares the phase of the internal clock signal to the reference signal and a control-logic block that is coupled to the output of the phase-detection circuit is used to increase or decrease a delay produced by a chain of delay elements used to delay the internal clock signal. U.S. Pat. Nos. 5,945,862 and 6,125,157 to Donnelly et al. represent two approaches to locking an internal clock signal to an external clock signal using delay elements.

It is desirable to provide for a fully digital DLL circuit that can be fabricated using standard digital design techniques.

SUMMARY OF THE INVENTION

In accordance with a first aspect of the present invention, a circuit for selectively delaying a reference clock signal is provided. The circuit includes a phase splitter coupled to a first delay line and a second delay line. Each delay line includes a set of output taps and has a multiplexor that is selectively coupled to the output taps. An output of each multiplexor is coupled to a latch. The latch provides an output clock signal, which may be fed back to a phase detector, where the phase detector also receives an input clock signal. A controller is coupled to the phase detector and, depending upon the output of the phase detector, provides control signals to each multiplexor.

In a preferred embodiment, the circuit is implemented using standard digital design techniques.

In accordance with a second aspect of the present invention, a method for recovering a clock signal from an input clock signal is provided. The method includes converting a reference clock signal into an in-phase reference and a complementary reference, and selectively delaying the in-phase reference and the complementary reference. The method further includes generating an output clock signal from the selected in-phase reference and the selected complementary reference.

In accordance with the preferred embodiment, the selective delay of the in-phase reference and the complementary reference is based upon a difference signal determined by comparing an input clock signal with a feedback clock signal, where the feedback clock signal is related to the output clock signal.

In accordance with another embodiment, the method is implemented using digital design techniques.

This summary is not intended to be all-inclusive, but rather illustrative. These and other aspects of the present invention, and its various embodiments, are described in greater detail below.

BRIEF DESCRIPTION OF THE DRAWINGS

Preferred embodiments of the present inventions are described with reference to the following drawings, wherein.

DETAILED DESCRIPTION OF PREFERRED EMBODIMENTS

In one preferred embodiment, a reference clock having a correct duty cycle, e.g. 50%, is split into an in-phase clock reference signal and a complementary reference clock signal, each of which is successively delayed using a pair of delay lines. A set of output taps on the delay line allows the selection of and variation in the length of the delay. A pair of multiplexors (MUXes) is used to select one output tap from each of the delay lines. In accordance with one preferred embodiment, a rising edge of a signal from the output tap selected from the delay line used to delay the in-phase reference signal is used to produce a rising edge in an output clock signal. Then, a rising edge of a signal from the output tap selected from the delay line used to delay the complementary reference signal is used to produce a falling edge in the output clock signal. A feedback clock signal is compared to the input clock signal in order to obtain a difference signal that reflects the phase relationship between the feedback clock signal and the input clock signal. A control circuit monitors the difference signal and generates a control signal that drives the selection performed by the MUXes such that a rising edge of the feedback clock is aligned or lock-in to a rising edge of the input clock signal.

In another aspect of the preferred embodiment, a power control signal controls delay elements within the delay lines and the control circuit is configured to generate the power control signal based upon the control signal provided to the MUXes such that unused elements in the delay lines are disabled during operation to reduce power consumption.

In still another aspect of the present invention, four additional MUXes are used to select output taps from each of the delay lines in order to produce a quadrature clock signal. The additional outputs taps are selected such that they are offset from the previously selected output taps by an offset value, where one offset output tap is advanced by the offset value and the other offset output tap is delayed by the offset value. The additional output taps are interpolated in order to generate the quadrature clock. A quadrature control circuit varies the offset value and monitors the relationship between edges in the signals from the offset output taps in order to drive the additional pairs of MUXes. The quadrature control circuit selects an offset value that results in the edges from the offset output taps being generally aligned.

Figure 1:
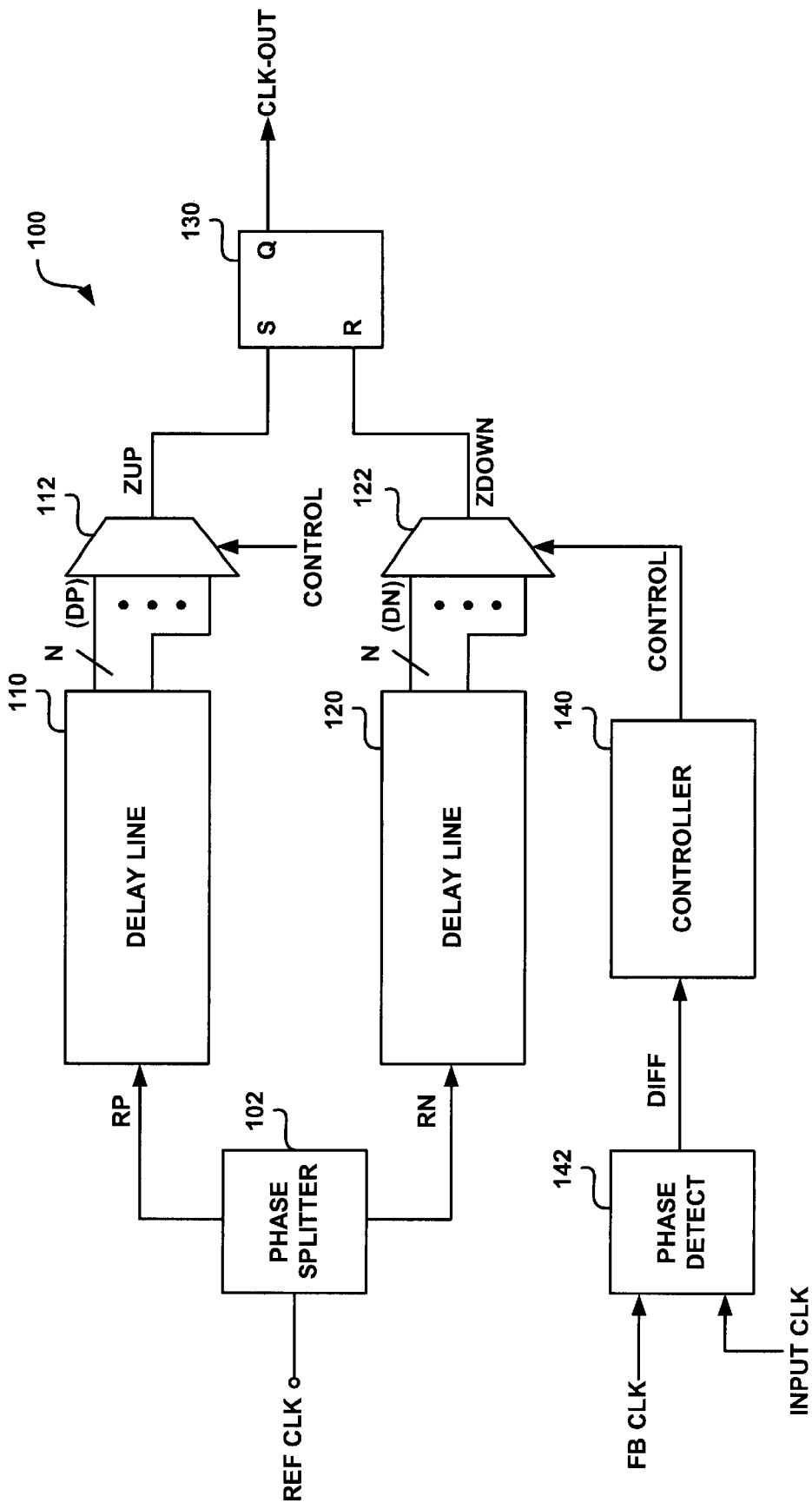
FIG. 1 is a functional block diagram of one embodiment of a DLL circuit according to the present invention.

FIG. 1 is a functional block diagram of one embodiment of a delay locked loop ("DLL") circuit according to the present invention. A reference clock signal REFCLK is received by a phase splitter 102, which splits the REFCLK into a positive phase reference signal RP (also referred to as an in-phase reference signal) and a negative phase reference signal RN that is 180° out of phase with RP (also referred to as the complementary reference signal). The positive phase reference RP is input to a delay line 110, which has N output taps that are input to a multiplexor (MUX) 112. The MUX 112 also receives a CONTROL signal that selects one of the N inputs from the delay line 110 to be output from the MUX 112 as a ZUP signal to set an S input of a Set/Reset latch 130. The delay line 110 successively delays the reference signal RP such that each one of the N output taps represents RP delayed by a multiple of a predetermined delay interval. Thus, selecting one of the N output taps from the delay line 110 using the MUX 112 permits the RP signal to be delayed by from 1 to N delay intervals before being input to the S terminal of the latch 130.

Likewise, the delay line 120 delays the negative phase reference signal RN by from 1 to N delay intervals, as selected by the MUX 122. The delay line 120 receives RN and has N output taps that are input to the MUX 122. The MUX 122 also receives the CONTROL signal, which determines which of the N output taps of the delay line 120 to output as a ZDOWN signal to a reset input R of the latch 130. The MUX 122 is configured to respond to the CONTROL signal in the same fashion to the response of the MUX 112. In other words, the delay line 120 and the MUX 122 are configured relative to the delay line 110 and the MUX 112 such that the ZUP and ZDOWN signals are complementary to one another in generating signals responsive to the CONTROL signal output by controller 140. The ZUP and ZDOWN signals control the up/down edges of the output signal. The output signal drives some collection of circuitry to produce a signal FB_CLK that is aligned in zero degrees in phase with the input clock signal. The resulting output clock signal CLKOUT generated by latch 130 is a clock signal whose edges are determined by the CONTROL signal and which has a 50% duty cycle.

A phase detector circuit 142 receives a feedback clock signal FB_CLK derived from the CLKOUT signal and also receives an input clock signal INPUT CLK that is the signal to which the circuit 100 is to lock onto. The CLK_OUT may move in time in a manner that the resulting phase relationship of the FB_CLK relative to the INPUT CLK is well managed.

The phase detector 142 compares the FB_CLK and the INPUT CLK and outputs a difference signal DIFF that indicates whether the phase of FB_CLK leads or lags the phase of INPUT CLK. The DIFF signal is received by the controller 140, which adjusts the CONTROL signal accordingly. As one example for the control circuit 140, the circuit may consist of a counter, which is incremented or decremented by the DIFF signal in order to adjust the CONTROL signal. It should be understood that someone skilled in art of PLL or DLL design will recognize that the circuit which provides the control signal to the VCO or delay-line of a DLL can be implemented in many fashions, and other circuits of varying complexity could also be used.

Figure 2:
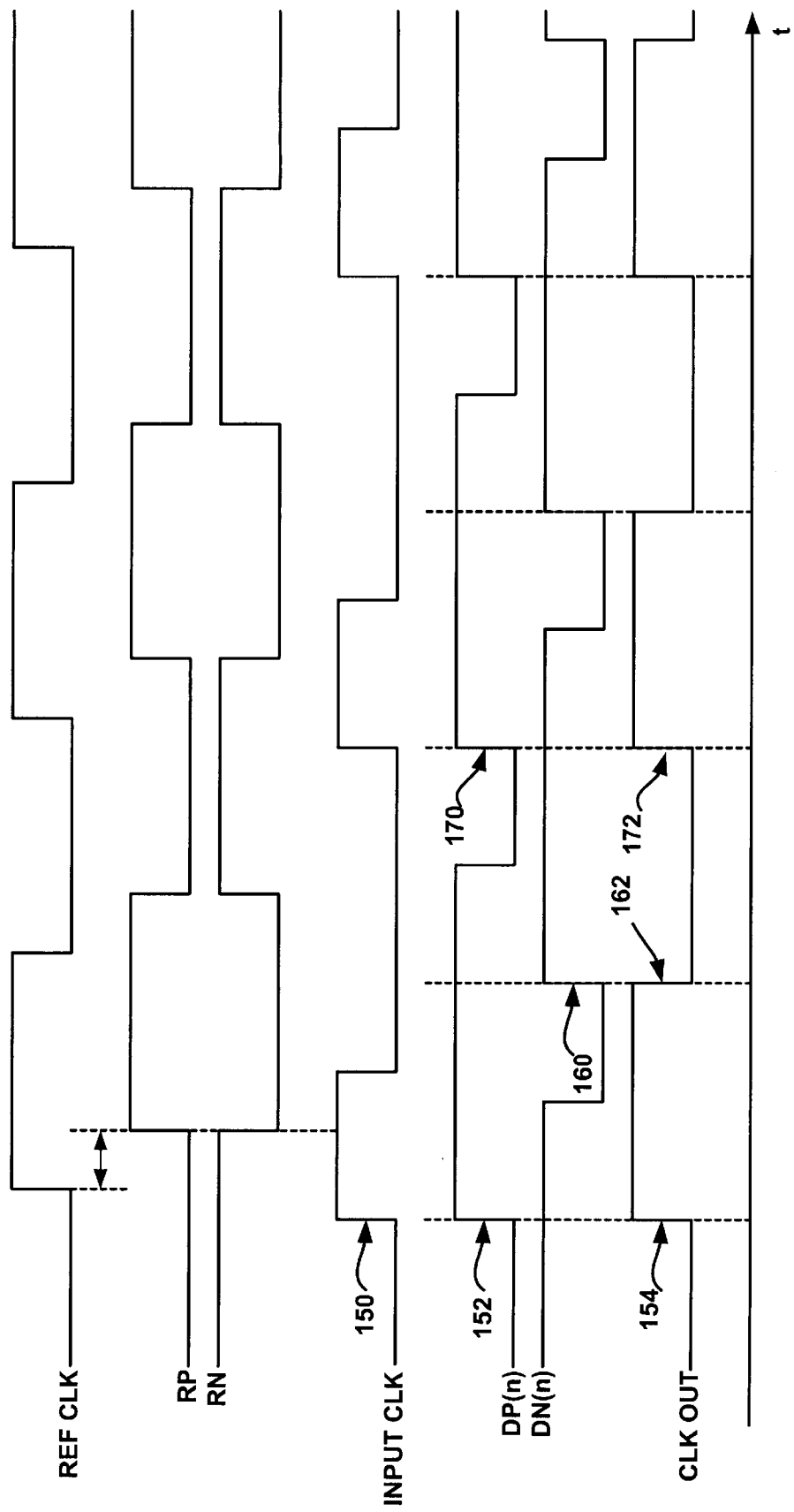
FIG. 2 is a timing diagram illustrating an example of the function of the DLL circuit of FIG. 1.

FIG. 2 is a timing diagram illustrating an example of the function of the DLL circuit of FIG. 1. In FIG. 2, the reference clock signal REFCLK is shown along with the reference clock signals RP and RN output from the phase splitter 102. Note that REFCLK has a 50% duty cycle. Also note that RP and RN are complementary to one another, e.g. 180° out-of-phase with one another and that a delay is introduced to RP and RN relative to REFCLK by the phase splitter 102.

FIG. 2 also includes an example of an external input clock signal INPUT CLK. Note that, in this example, the INPUT CLK signal waveform is distorted due to the effects of transmission and, consequently, the received INPUT CLK waveform does not have a 50% duty cycle. In one embodiment, phase detector 142 compares the phase of rising edge 150 of INPUT CLK to the FB CLK, which is derived from CLK OUT. Controller 140 receives the DIFF signal and adjusts the value of the CONTROL signal in order to select a delay tap DP(n) from delay line 110 that aligns the rising edge of FB CLK with the rising edge 150 of INPUT CLK. In this example, DP(n) is selected such that rising edge 152 of DP(n) is aligned with rising edge 150 of INPUT CLK. The rising edge 152 of DP(n), in turn, drives the set input of the latch 130 triggering the rising edge 154 of the CLK OUT signal.

The CONTROL signal will also select DN(n), from the delay line 120, for output by the MUX 122 to the reset terminal of the latch 130. DP(n) and DN(n) are generally complementary to one another, but are typically distorted by their respective delay lines 110 and 120 such that neither DP(n) nor DN(n) will have a correct 50% duty cycle. However, the distortion will effect the rising edges of DP(n) and DN(n) in the same manner. Therefore, while the duty cycles of DP(n) and DN(n) are distorted, the relationship between the rising edge 152 of DP(n) and the rising edge 160 of DN(n) is reliable. Thus, in the present invention, rising edge 160 of DN(n) is used to drive the reset input of the latch 130 triggering a falling edge 162 of the CLK OUT. The cycle then continues as demonstrated by next subsequent a rising edge 170 of DP(n) that triggers a rising edge 172 of the CLK OUT. The result is that the circuit 100 of FIG. 1 may produce a CLK OUT signal having a 50% duty cycle.

Note that the timing diagram of FIG. 2 has been simplified to demonstrate the relationship between edges in the various waveforms. The actual waveforms are subject to further delays introduced, for example, by the MUXes 112 and 122, the latch 130, as well as other circuitry that is intermediate to the CLK OUT signal and the FB CLK signal.

Figure 3:
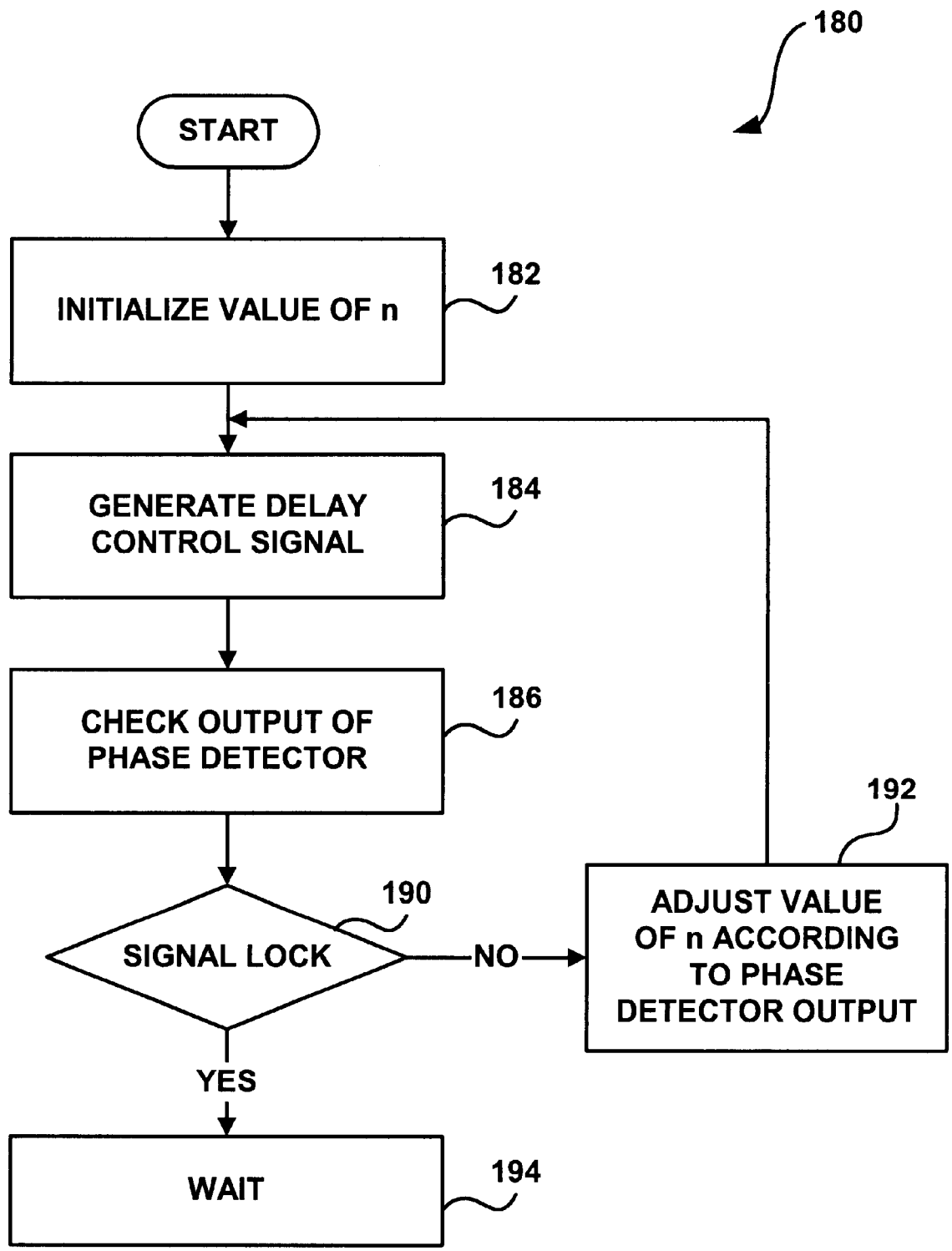
FIG. 3 is a control flow diagram illustrating an embodiment of the function performed by the controller of FIG. 1.

As noted above, the controller 140 may be, for example, a counter, or composed of complex circuitry, such as a processor, that monitors the output of the phase detector 142 and generates the CONTROL signal. FIG. 3 is a control flow diagram illustrating an embodiment of a process 180 performed by the controller 140 for generating the CONTROL signal. In the process 180, at step 182, an initial value of n is selected and, at step 184, the CONTROL signal for controlling the delay of delay lines 110 and 120 is generated according to the initial value of n selected at step 182.

At step 186, the output of the phase detector 142 is checked to determine if signal lock has been achieved between FB CLK and INPUT CLK, e.g. the rising edge of FB CLK is aligned with the rising edge of INPUT CLK. If signal lock is achieved, then control flow branches at step 190 to step 194, where the process waits for a short time interval before branching back to step 186 to check the output of the phase detector 182 again.

If signal lock is not achieved, then control flow branches at step 190 to step 192 where the value of n is adjusted according to the phase detector output. For example, if the DIFF signal is negative, then n is decremented. If the DIFF signal is positive, then n may be incremented. Process 180 then branches back to step 184, where the CONTROL signal is generated according to the adjusted value of n.

Note that other approaches are also possible. For example, the signal lock branch step 190 and wait step 192 may be omitted so that the value of n is always adjusted. In this case, when signal lock is achieved, the value of the DIFF signal will toggle between positive and negative on each loop through the process. Control for DLLs is well understood in the art and one of ordinary skill will readily appreciate that the circuit of FIG. 1 may be adapted to work with a variety of approaches to DLL design.

Figure 4:
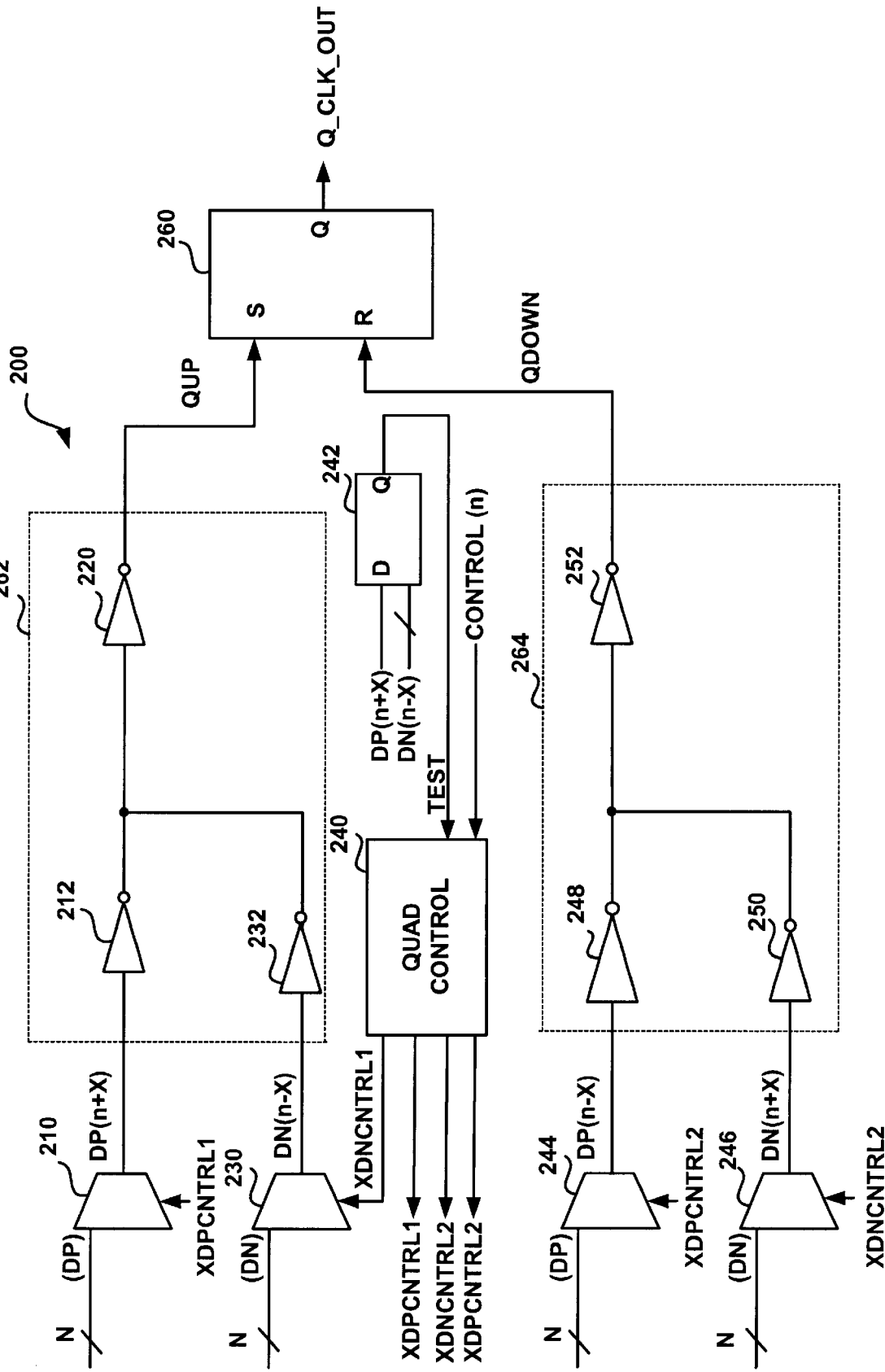
FIG. 4 is a logic circuit diagram illustrating an embodiment of a circuit for generating a quadrature clock according to one aspect of the present invention.

In another embodiment, a quadrature clock signal may also be generated. A quadrature clock is a clock that is out-of-phase by 90° or 270° from a main clock signal. FIG. 4 illustrates an embodiment of a quadrature clock generation circuit 200 that may be used in combination with the circuit of FIG. 1. The quadrature clock generation circuit 200 includes a MUX 210 that receives N output tap lines of the delayed signal DP from the delay line 110, and is controlled by a control signal XDPCTRL1, which selects one of the taps DP(n+X) for output to a first input of an interpolator circuit 262. The interpolator circuit 262 illustrated in FIG. 4 is composed of three inverters 212, 220 and 232. Interpolator circuits are generally understood to those of ordinary skill in the art, and other interpolator designs may be adapted for use in the present invention. The circuit 200 further includes a second MUX 230, which receives the N output tap lines of the delayed signal DN from the delay line 120 and a control signal XDNCNTRL1, which selects one of the taps DN(n−X) for output to a second input of the interpolator circuit 262.

The interpolator circuit 262 interpolates between a rising edge of the DP signal and the rising edge of the DN signal, i.e., it takes an average of the 0-degree signal and the 180-degree signal to generate a 90-degree QUP signal. To do that, the interpolator 262 uses a late version of the DP signal and an early version of the DN signal, i.e., the signals DP(n+X) and DN(n−X), respectively.

The inverter 212 of the interpolator circuit 262 receives the DP(n+X) signal, and the inverter 232 receives the DN(n−X) signal. The outputs of both inverters are coupled to the input inverter 220, which possesses a parasitic capacitance. The inverters 212 and 232 are relatively small devices relative to the inverter 220. For instance, the inverter 200 may be twice the size of the inverters 212 and 232. The inverters 212 and 232 will charge the parasitic capacitance of the input of the inverter 220 until a threshold voltage for the inverter 220 is reached causing its output to change state in order to generate a QUP signal to set an S input of an RS latch 260. When the signals driving the inverters 212 and 232 are separated in time by less than the time it takes for the inverter 212 to fully transition the output of the inverter 220, then the inverter 232 contributes to the voltage transition at the output of the inverter 220. Thus, the interpolator circuit 262 will interpolate between a late version of DP signal and an early version of the DN signal in order to obtain a 90-degree QUP signal.

Further, as illustrated in FIG. 4, the circuit 200 includes a second pair of MUXs 244 and 246, and a second interpolator circuit 264 composed of inverters 248, 250, and 252 that generate a 270-degree QDOWN signal. The MUX 244 receives the N output tap lines of the delayed DP signal from the delay line 110, and is controlled by a control signal XDPCNTRL2, which selects one of the taps DP(n−X) for output to the second interpolator circuit 264. Similarly, the MUX 246 receives the N output tap lines of the delayed signal DN from the delay line 120 and control signal XDNCNTRL2, which selects one of the taps DN(x+N) for output to the interpolator circuit 264.

To generate the QDOWN signal, the interpolator circuit 264 takes an average of the 180-degree signal and the 0-degree signal (or 360-degree signal) to generate a 270-degree QDOWN signal. To do that, the interpolator 264 uses an early version of the DP signal and a late version of the DN signal, i.e., the signals DP(n−X) and DN(n+X), respectively. The QDOWN signal is then input to a reset input R of the latch 130, and the latch 130 outputs a quadrature clock Q_CLK_OUT that is out-of-phase by 90 degrees or 270 degrees from the main clock.

The circuit 200 further includes a quadrature control circuit 240 that generates the four control signals XDPCNTRL1, XDNCNTRL1, XDPCNTRL2, and XDNCNTRL2 that are input to the MUXes 210, 230, 244, and 246, respectively. The quadrature control circuit 240 receives a TEST signal along with the value n from the CONTROL signal of the control circuit 140 of FIG. 1 and uses the values of these signals to generate the four control signals for the MUXes. The value of the TEST signal qualifies the value of the offset signal X used by the quadrature control circuit 240. As illustrated in FIG. 4, a phase detection circuit, such as a D flip-flop 242, generates the TEST signal. The DP(n+X) signal selected at the MUX 210 drives a data input terminal of the D flip-flop 242, while the DN(n−X) selected at the MUX 230 drives a clock input terminal of the D flip-flop 254. A Q output terminal of the flip-flop 254 generates the TEST signal for input to the quadrature control circuit 240.

According to one embodiment, starting with a small value of X and incrementing it, the flip-flop 242 will change the state from 1 to 0 at some value of X that is used to generate the QUP and QDOWN signals. Similarly, a large value of X could be first selected and then decremented until the transition occurs. Alternatively, the DN(n−X) signal could be input to the D input, and the DN(n+X) could be then input to the clock input of the D flip-flop 242. In such an embodiment, the selected value of X corresponds to a value of X when the flip-flop 242 changes from 0 to 1. Thus, the phase detection circuit detects when the first input is no longer ahead of the second input, at which point the step of incrementing/decrementing the value of X is stopped, and the value of X can be used as an input to the quadrature control circuit 240.

The function of the interpolator of FIG. 4 is further explained below in conjunction with FIG. 6.

Figure 5:
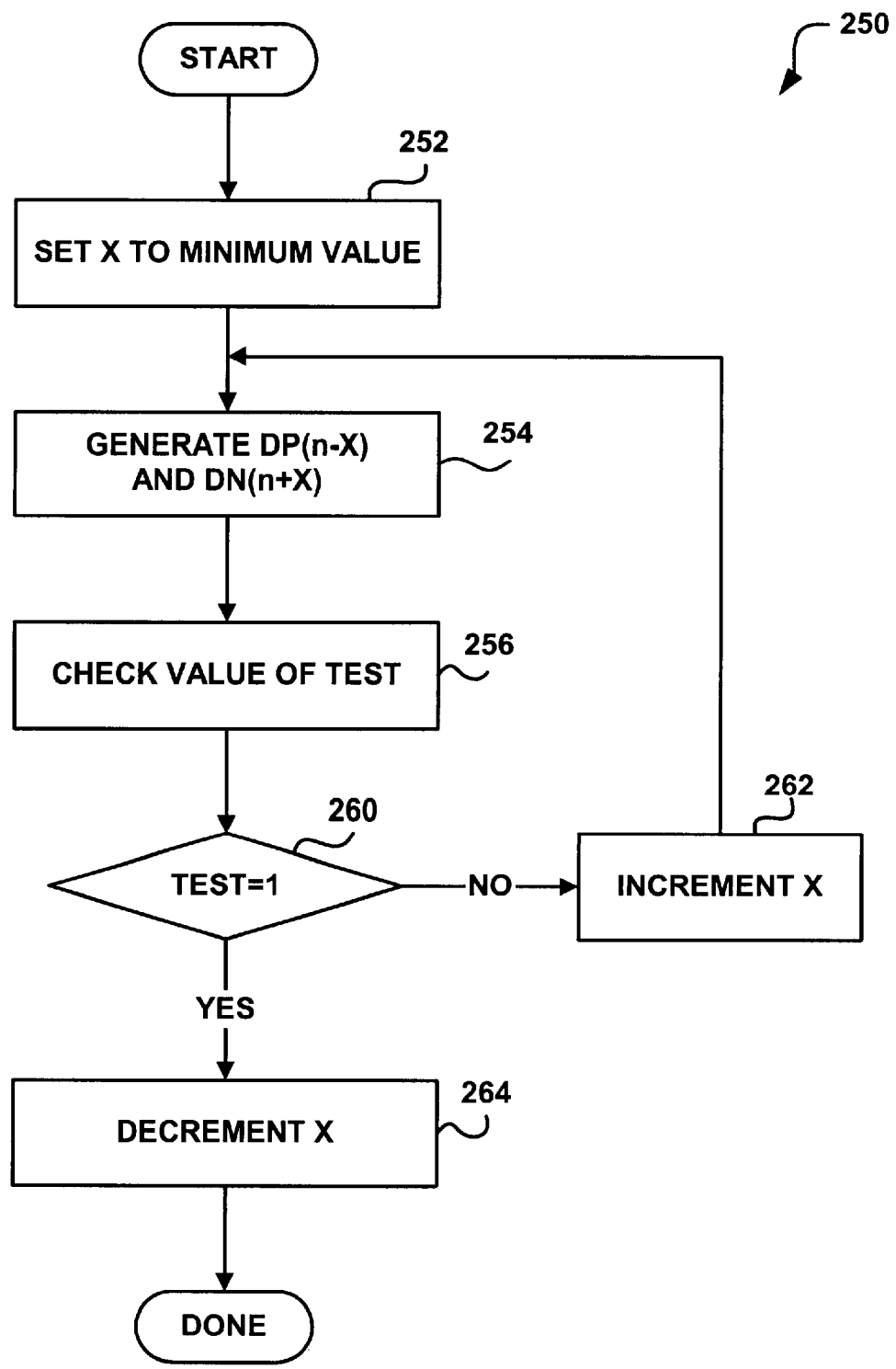
FIG. 5 is a control flow diagram illustrating an embodiment of the function performed by a controller to generate control signals to obtain the quadrature clock signal from the circuit of FIG. 4.

In FIG. 4, a change in state of the TEST signal from the Q output terminal of the flip-flop 242 indicates the midpoint between the two signals being interpolated. FIG. 5 is a flow chart illustrating one embodiment of a process 250 performed by the quadrature control circuit 242. The process 250 starts from a minimum value for X, which is initialized at step 252. The quadrature control circuit 240 then generates control signals at step 254 based upon DP(n+X) and DN(n−X), respectively. The functionality of the control circuit 240 may be integrated with some embodiments of the control circuit 140 of FIG. 1.

The value of the TEST signal is checked at step 256 to determine if the TEST signal has transitioned from logic one to logic zero. If the TEST signal is at logic zero, then the midpoint may have not been reached, and the control flow branches to step 262, where the value of X is incremented. The control flow then branches back to step 254 where a new set of control signals is generated based on the incremented value of X. The value of the TEST signal is again verified at step 256. If the TEST signal has transitioned to the logic zero, then the control flow branches at step 260 to step 264, where the value of X is decremented. The value of X is decremented because the transition to logic zero indicates that the midpoint has been passed and the value of X is decremented, in this embodiment, to obtain a more accurate midpoint value. The value of X is now set for operation, and the QUP and QDOWN signals are generated. As mentioned in the preceding paragraphs, instead of setting the value of X to a minimum value, the value of X may be set to a maximum value and then decremented until the transition is detected.

Figure 6:
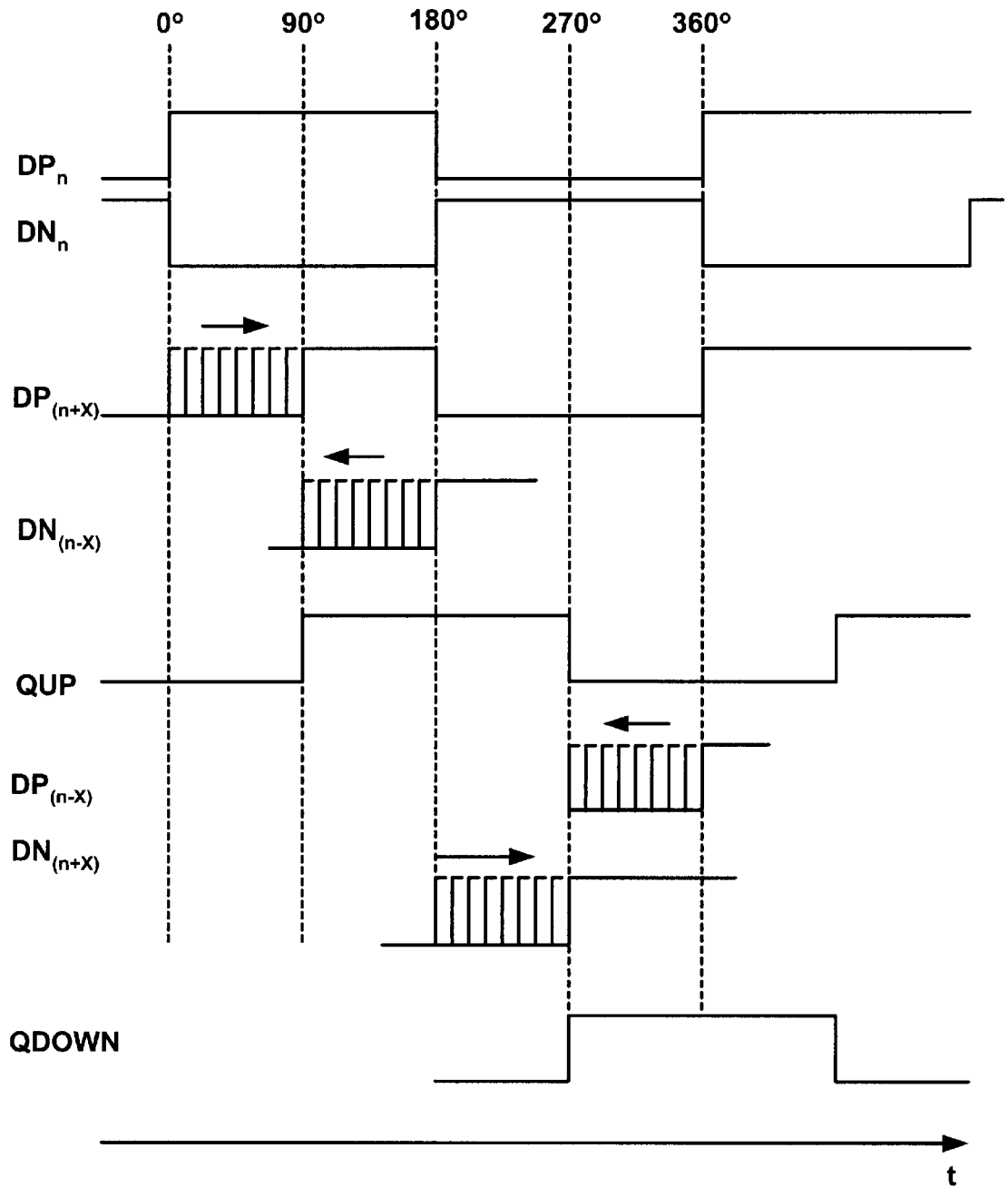
FIG. 6 is a timing diagram illustrating an example of the function of the quadrature clock circuit of FIG. 4.

Interpolation of the 90-degree quadrature clock signal is illustrated in the waveform of the timing diagram of FIG. 6. The edges produced by the DP(n+X) and the DN(n−X) are shown as the value of X is successively incremented (or decremented) until the two edges converge at 90-degrees with the result being a QUP signal.

As noted above, a 270-degree clock signal may alternatively be generated. Whereas the 90-degree QUP signal was derived by interpolating a midpoint that is delayed from DP(n) and advanced from DN(n), e.g., taking a late DP signal and an early DN signal, e.g., using DP(n+X) and DN(n−X), a 270-degree QDOWN signal can be derived from an early version of DP signal and a late version of the DN signal, e.g., DP(n−X) and DN(n+X). The interpolation of the 270-degree QDOWN signal is also illustrated in the waveforms of the timing diagram of FIG. 6.

Figure 7:
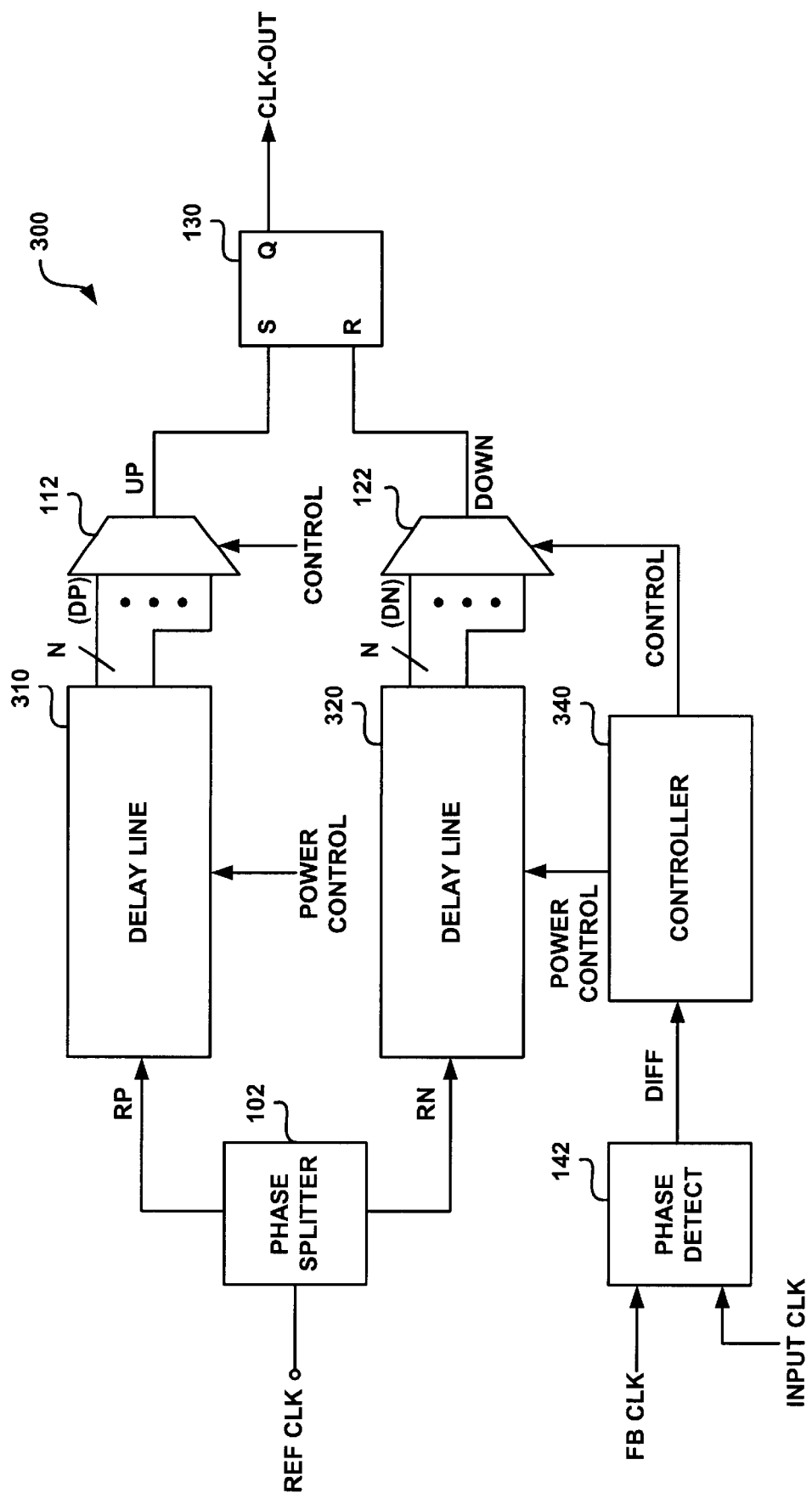
FIG. 7 is a functional block diagram of another embodiment of a DLL circuit according to the present invention.

In accordance with another embodiment, unused delay elements of the delay lines may be powered down to save power. For example, once the value of n is determined, some or all of the subsequent delay elements in the delay line may be turned off. FIG. 7 is a functional block diagram illustrating another embodiment of a DLL circuit 300 according to the present invention. The DLL circuit 300 of FIG. 7 is similar to the DLL circuit 100 of FIG. 1, except that delay lines 310 and 320 are composed of delay elements that may be powered down and a controller circuit 340 is adapted to generate a POWER CONTROL signal for powering down elements of the delay lines 310 and 320. In this embodiment, the controller 340 is obviously more complex than an up/down counter.

Figure 8:
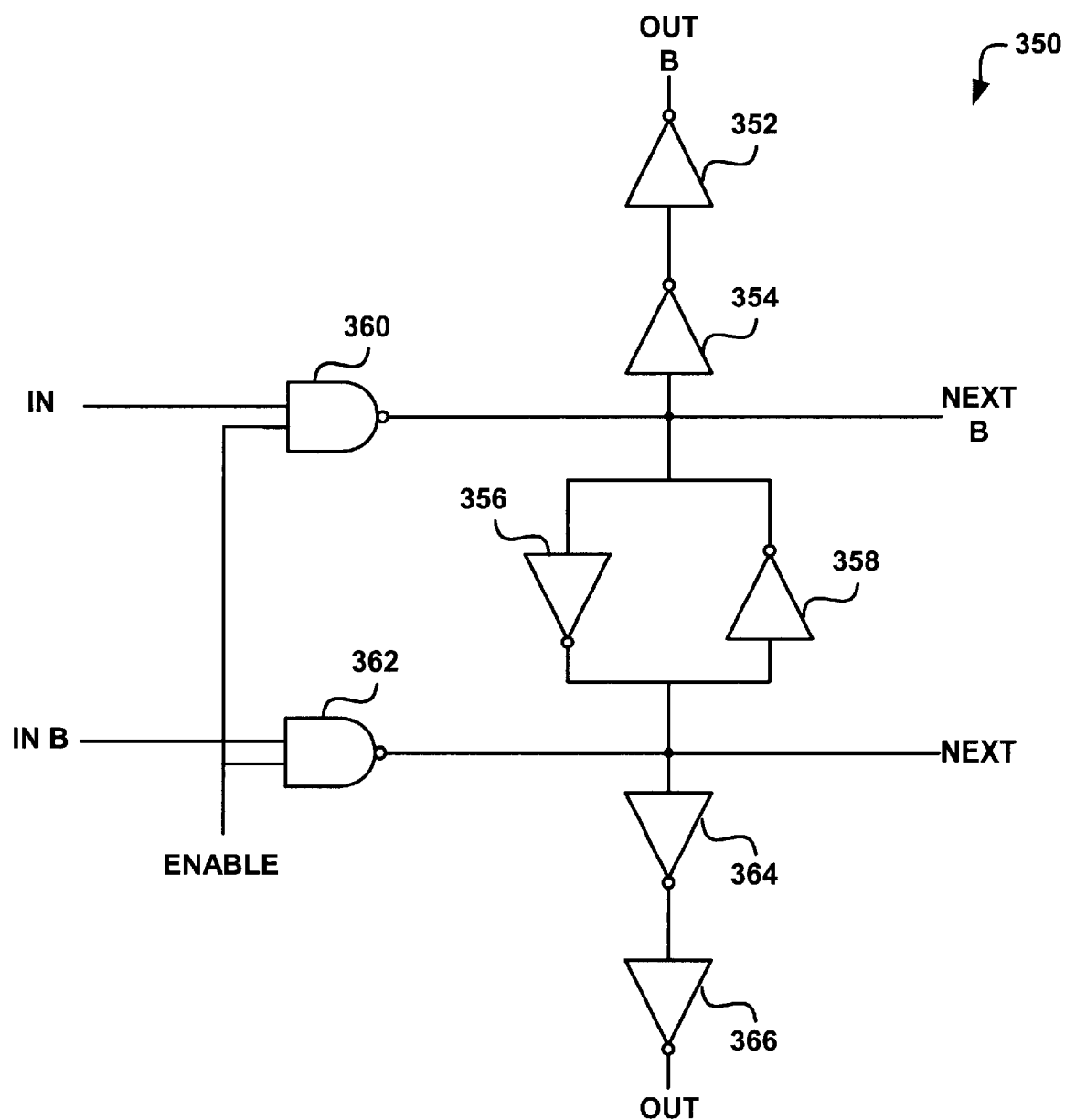
FIG. 8 is a functional block diagram illustrating an example of a delay element suitable for use in the delay line circuits of FIG. 7.

FIG. 8 illustrates one example of a delay element circuit 350 that can be powered down and is suitable for use in the delay lines 310 and 320 of FIG. 7 and FIG. 1. The circuit 350 is a differential circuit that receives and outputs complementary signals. Inputs IN and INB receive the delayed signal output from a previous delay element in a sequence of the delay line. Outputs NEXT and NEXTB are output, for example, to the next delay element in the sequence of the delay line. OUT and OUTB are output tap signals that are output to the MUXes 112 and 122. The delay for the delay element circuit 350 is primarily provided by NAND gates 360 and 362. Inverters 356 and 358 primarily help keep the delay pass complimentarily. An ENABLE signal is input to each of the NAND gates 360 and 362. When the ENABLE signal is at a logic one, then the input signal at input terminals IN and INB is enabled to pass through the delay element to the next delay element and to the output terminals OUT and OUTB. When the ENABLE signal is at a logic zero, then the input signal at input terminals IN and INB is blocked. The NAND and inverter gates may be selected such that no current is drawn when no data transitions take place, e.g. complementary metal-oxide semiconductor (CMOS) logic.

The POWER CONTROL signal output by the control circuit 340 separately drives the ENABLE line of the delay elements in the delay lines 310 and 320. Once the value of n is determined to align the DLL circuit with the INPUT CLK signal, then unused delay elements may be disabled to reduce power consumption.

Figure 9:
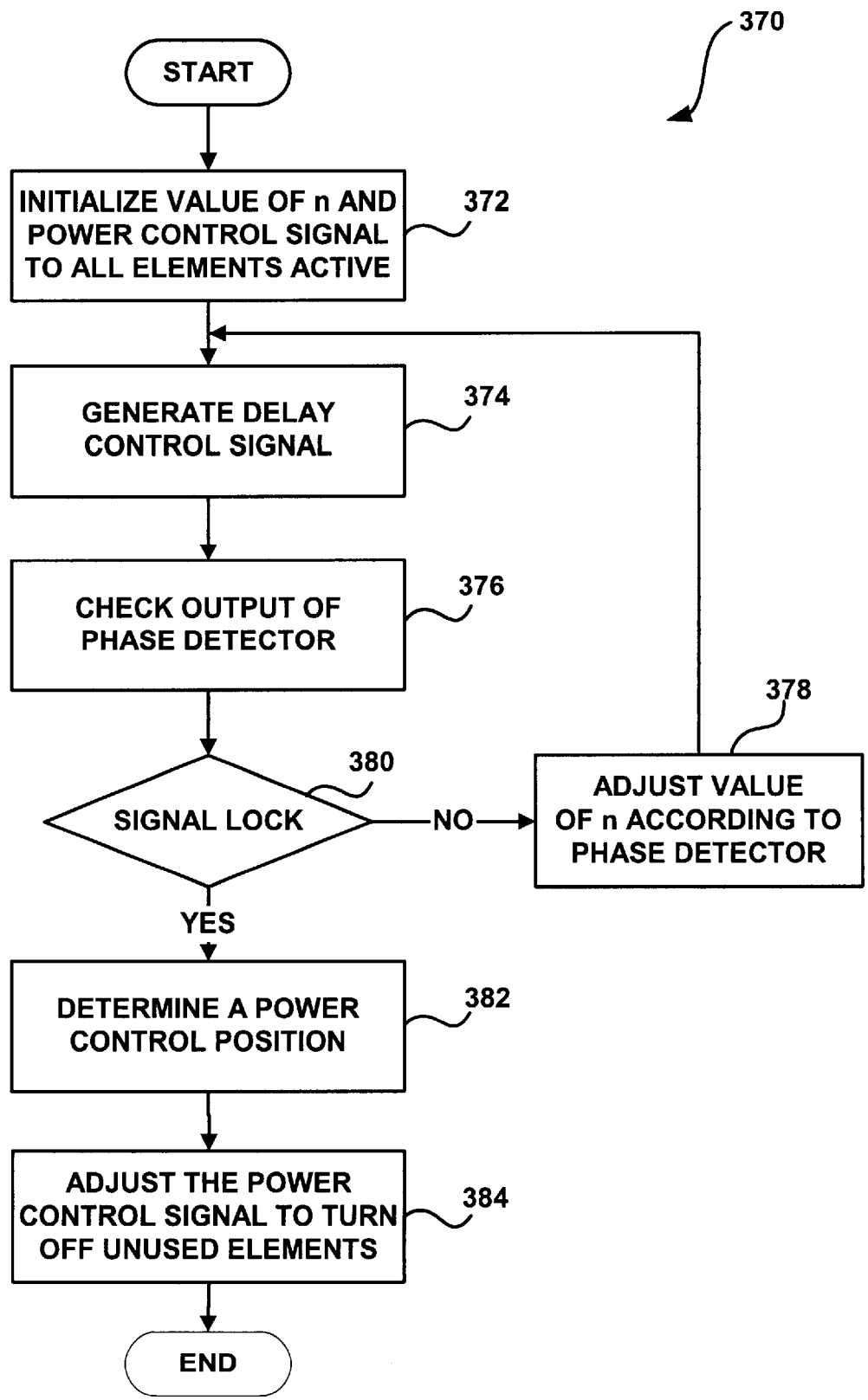
FIG. 9 is a control flow diagram illustrating an embodiment of the function performed by the controller of FIG. 7.

FIG. 9 is a control flow diagram illustrating an embodiment of a process 370 performed by control circuit 340 for determining the value of n and setting the POWER CONTROL signal. Process 372 is similar to process 180 of FIG. 3. At step 372 (step 182 in FIG. 3) of process 370, the control circuit 340 initializes the value of n, and the POWER CONTROL signal is initialized such that all elements of delay lines 310 and 320 are active. At step 374 (step 184 in FIG. 3), the delay CONTROL signal is generated that drives the MUXes 112 and 122 of the delay circuit 300 to select the output taps from the delay lines 310 and 320. At step 376 (step 186 in FIG. 3), the output from a phase detector is checked to determine whether the phase of the FBCLK signal lags or leads the phase of the INPUT CLK signal. If the circuit 300 has not locked to the INPUT CLK signal, then control flow branches at step 380 to step 188, where the control circuit 340 adjusts the value of n according to the signal output by the phase detector 142 and the control flow returns to step 384 where the delay CONTROL signal is generated using the new value of n.

If the circuit 300 has locked onto the INPUT CLK signal, then the control flow branches at step 380 to step 382, where the control circuit 340 determines a power control position that may be used to adjust the POWER CONTROL signal to turn off unused delay elements in the delay lines 310 and 320. At step 384, the control circuit 340 adjusts the power control signal to turn off unused elements, and the adjustment is based on the power control position determined at step 382.

According to an alternative embodiment, the N delay stages ahead of the maximum delay stage of interest may be powered-down. The power control circuit monitors the ZLOOP and QLOOP delay line usage and applies a power down signal to positions "MAX+N," where "MAX" is the highest position being used, and N is 1 and greater.

In a DLL circuit having a large delay line, an entire cycle of the reference clock frequency might be contained within the delay line. For instance, each step of a 64-bit delay line might be 50 pS, thus, producing a delay of 3.2 nS on the entire line. In such an embodiment, if the reference clock has a frequency of 500 MHz, the entire reference clock cycle might be represented in 2.0 nS, or 40 stages, of that delay line, leaving 24 stages of the line unused. Therefore, it might be advantageous to detect a cycle boundary, where a DLL circuit crosses over from a maximum delay value to a minimum delay value in locking onto a signal.

Figure 10:
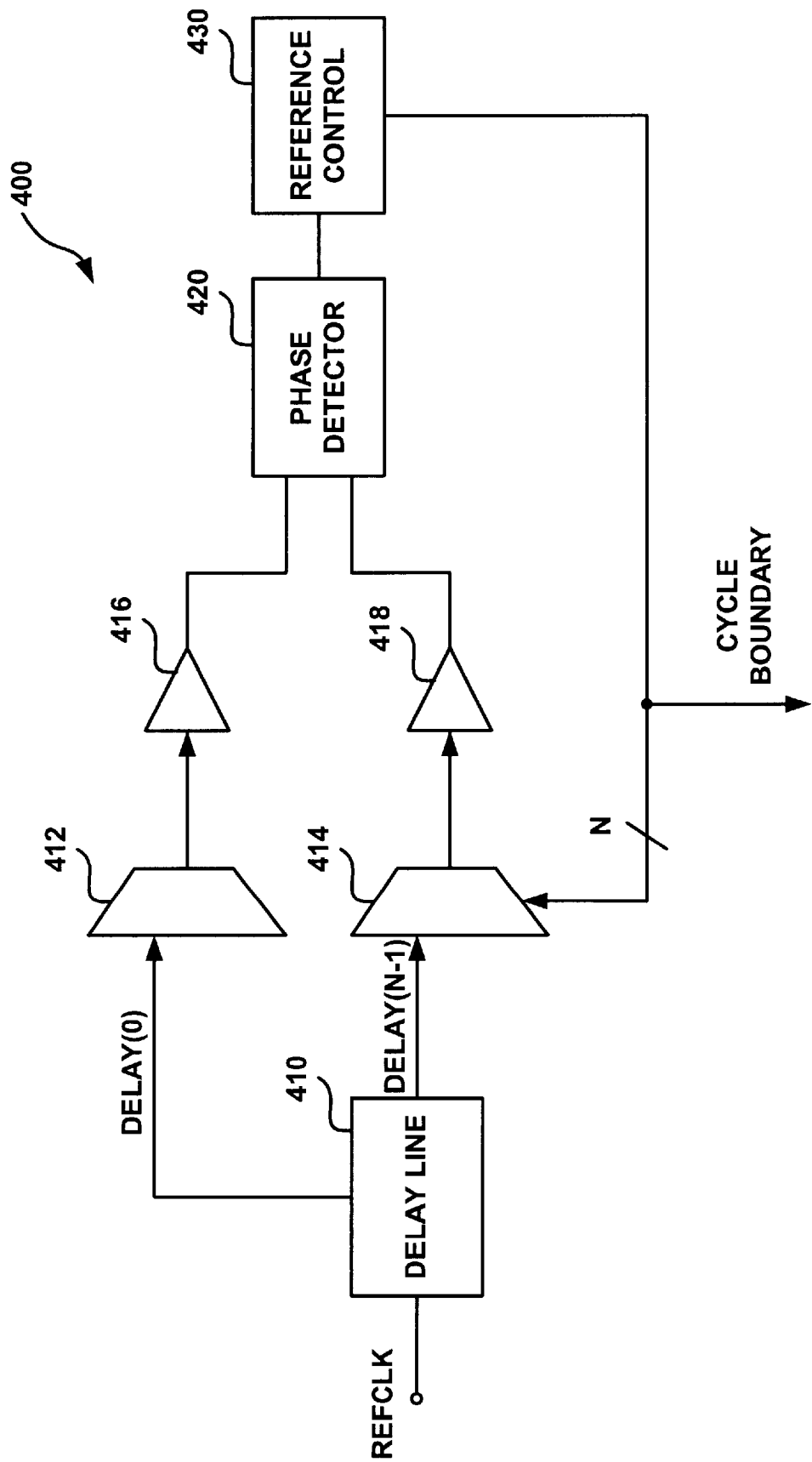
FIG. 10 is a functional block diagram illustrating an example of a circuit for detecting a cycle boundary in the delay line circuits of FIG. 7.

FIG. 10 illustrates an example of a circuit 400 for detecting a cycle boundary and generating a CYCLE BOUNDARY signal that may be received by a control circuit adapted, for example, to adjust the CONTROL signal to the MUXes 112 and 122 or the POWER CONTROL signal accordingly. In the circuit 400, a delay line 410 having a series of output taps receives the REFCLK signal. A first delay output tap Delay(0) is output to a MUX 412, and a maximum delay output tap Delay(N–1) is output to a MUX 414. An output of the MUX 412 drives a buffer 416 whose output is received by a phase detector 420. Likewise, an output of the MUX 414 drives a buffer 418 whose output is also received by the phase detector 420. An output of the phase detector 420 is received by a reference control 430 that generates the CYCLE BOUNDARY signal.

In one embodiment, the phase detector 420 receives a first output of the delay line 410, a bit position (0), and finds another point on the delay line 410 that matches the bit position (0) in phase. To do that, the phase detector 420 may compare other bit positions, for example sequentially and in order, until the phase detector 420 finds a match. For instance, the phase detector 420 might check a position N to determine if the bit position N is ahead or after the bit position (0), and, if it is not ahead, the phase detector 420 may instruct reference control 430 to increment the bit position to N+1. At some point, if the reference frequency is fast enough, the phase detector 420 detects a point where the bit position "N" happens before the bit position "0". At that point, the phase detector 420 determines that one-cycle of the reference clock takes N stages of the delay line 410.

According to one embodiment, the cycle boundary number N determined using the cycle boundary detector circuit 400 may be fed back to manage the primary loop circuit 140 described in reference to FIG. 1. During a normal operation, the circuit 140 may be arranged to increment its bit position by one bit position every hour in order to track a slowly drifting reference signal. After some time, a loop may approach a last bit position, such as a bit position 64 of a 64-stage delay line, for instance. Instead of approaching the 64th stage of the delay line, at which point the loop becomes unlocked, and the data might be lost while the loop re-acquires, the loop might utilize the number N determined by the cycle boundary detector circuit of FIG. 10. Using the value of N, the loop may determine that the bit position "64–N" may be considered as the bit position 64. Therefore, for instance, if N=40, instead of moving to position 64 on an "increment" step, the controller may move to position 24. Alternatively, during an increment step, the controller may move to position "64–N+M", where M is a fixed value, such as 2, for instance.

Further, the value of "N" determined using the cycle boundary circuit 400 may also be used by the quadrature loops. For example, if a quadrature loop ("Q-loop") is locked at bit position 60, and the Q-loop controller is adapted to use +/–10 bit positions to create QUP and QDOWN signals, the quadrature loop might require bit positions 50 and 70. However, in a 64-bit delay line, the Q-loop controller will not be able to use the 70th bit position. However, if N=40, the Q-loop may use bit positions 50 and 30.

Figure 11:
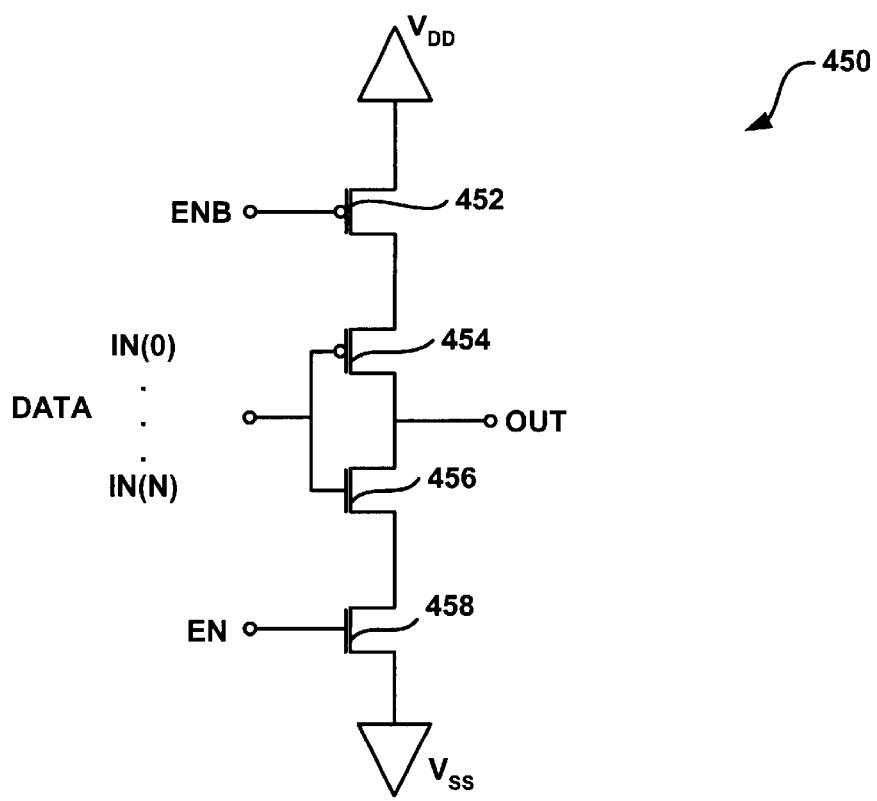
FIG. 11 is a transistor circuit diagram which illustrates an example of a prior-art tri-state inverter circuit configured to be enabled by a differential enable signal that may cause a multiplexor circuit which uses it to experience a data dependent response.

One problem that can arise in a DLL is that the circuits used to implement the MUX elements may have data dependent response characteristics, e.g. the speed of the response to a logic zero is different than the speed of the response to a logic one. FIG. 11 illustrates an example of an inverter circuit 450 configured to be enabled by a differential enable signal that may experience a data dependent response. In the circuit 450, an enable signal EN, such as a line from the POWER CONTROL signal of the circuit 300 of FIG. 7, drives an NMOS transistor 458 while a complementary enable signal ENB drives a PMOS transistor 452. When EN and ENB are active, then a DATA signal is inverted by a PMOS transistor 454 and an NMOS transistor 456 to drive an output terminal OUT. When EN and ENB are inactive, then the inverter formed by the transistors 454 and 456 is disabled because no current can flow between the power supply rails VDD and Vss. The circuit 450 suffers from data dependent behavior because the amount of capacitance that the non-selected MUX paths contribute to the output node is a function of the data signal driving the non-selected nodes. For example, if a first data input IN(0) is selected, the devices 454 and 456 contribute one value of capacitance to the OUT node if the DATA(0) is low, and another capacitance value if DATA(0) is high. During the operation, the propagation delay thru the MUX element from the selected input to the common output will therefore vary as a function of the data states on the non-selected inputs, thus, resulting in a data dependent response.

Figure 12:
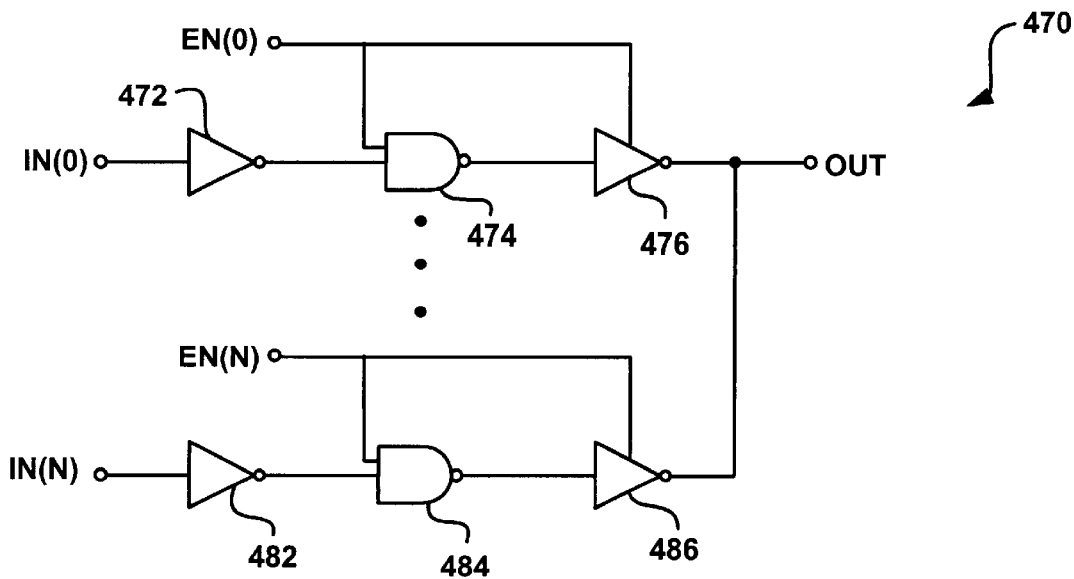
FIG. 12 illustrates a circuit that addresses the problem of data dependent response exhibited by the circuit of FIG. 11.

FIG. 12 illustrates a circuit 470 that addresses the problem of data dependent response exhibited by the circuit of FIG. 11. In the circuit 470, a first data input IN(0) is input to an inverter 472 which drives one input of a NAND gate 474. An output of the NAND gate 474 drives an input of tri-state inverter 476. The output of the inverter 476 is coupled to a common output circuit node OUT. A second input of the NAND gate 474 is driven by a first enable signal EN(0) derived from the CONTROL signal received by the MUX. The inverter 476 receives its tri-state control from EN(0). Each input to the MUX has a similar circuit, as illustrated by the ellipses leading to gates 482, 484 and 486 for processing Nth data input IN(N) and enable signal EN(N). Via the circuit shown in FIG. 12, all of the non-selected MUX paths contribute the same amount of capacitance load to the output node, regardless of the data values on the non-selected paths. When EN(0) is low, the logic gate 474 blocks any contribution from IN(0) to the logic state at the input of the tri-state inverter 476. If EN(0) is low, the logic gate 474 drives the node at the input of the tri-state inverter 476 to a logic high, removing data dependence described in reference to FIG. 11. Alternatively, the logic gate 474 could be replaced with other logic elements that achieve the same functionality.

Figure 13:
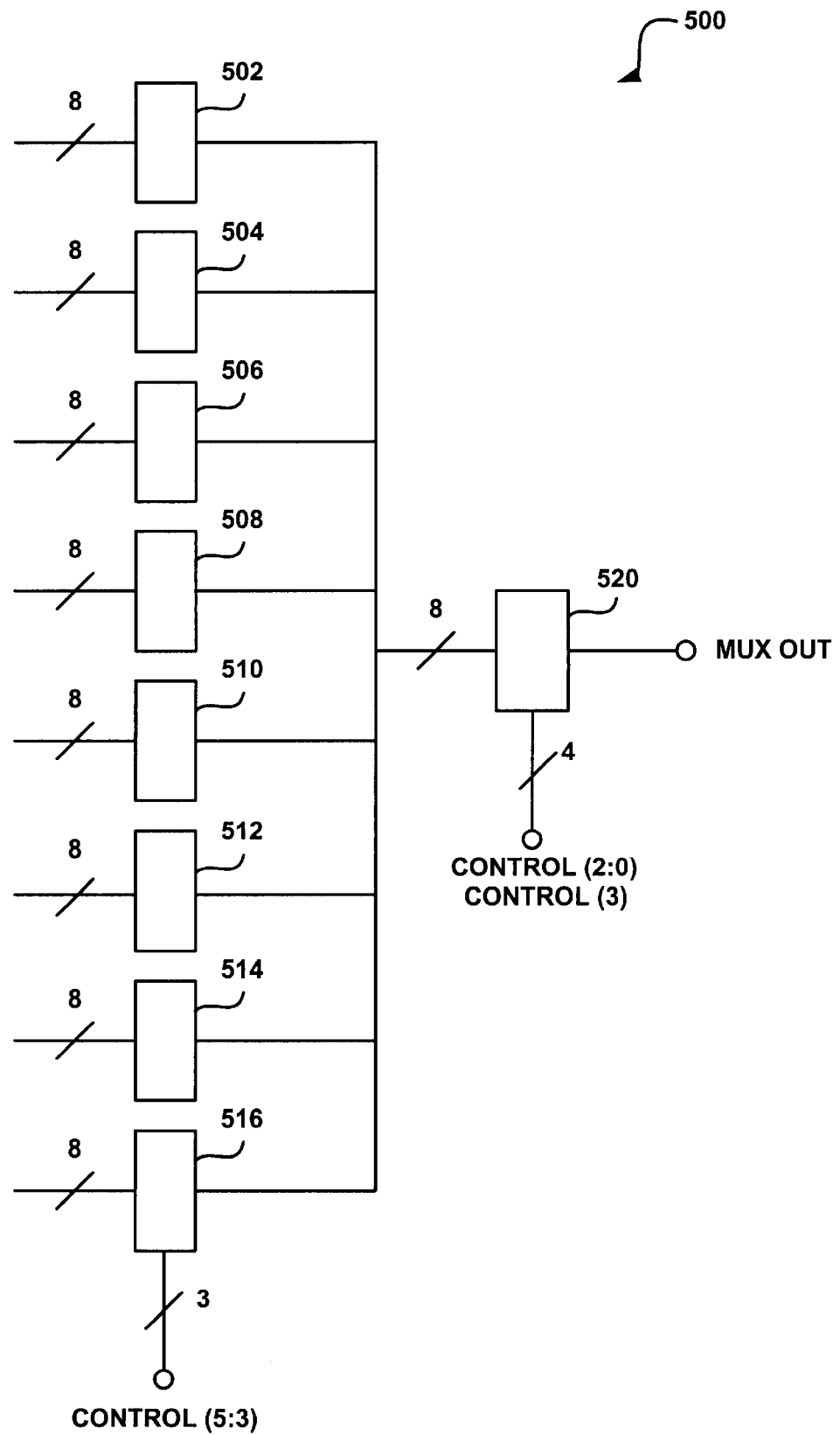
FIG. 13 is a functional block diagram illustrating an example of a two level multiplexor design suitable for use with the circuits of FIG. 1 and FIG. 7.

FIG. 13 illustrates an example of a two-level 64 input MUX circuit 500 suitable for use in the circuits discussed above. MUX circuit 500 is constructed from a first level of 8-to-1 MUXes 502, 504, 506, 508, 510, 512, 514 and 516 that are driven by most significant three bits of the CONTROL signal CONTROL <5:3>. The output of each of the first level MUXes is input to a second level 8-to-1 MUX 520 that is driven by the next three least significant bits CONTROL <2:0> and a control bit <3>.

The output of 8-to-1 MUX 520 produces an output MUX_OUT for the 64-input MUX circuit 500. According to an exemplary embodiment, any of the 64 inputs to the MUXes 502–516 can be selected to become the MUX OUT signal. However, the 64 input signals are not just any digital signals. Instead, they correspond to 64 taps of the delay line. Therefore, a signal transition at a tap "0" may occur 50 pS before a signal transition at a tap "1", which then transitions 50 pS earlier that a signal at a tap "3", and so on. This characteristic of the delay line, where every consecutive signal is delayed with respect to its first neighboring signal, could change if the MUX adds more error than this unit-delay spacing. To minimize the error introduced by the MUX, it is desirable that the change between any two neighboring signals introduced by the MUX is identical.

For instance, the first eight taps of the delay line could be connected to the first MUX 502, and the next eight taps could be connected to the second MUX 504, and so on. In such an embodiment, if the MUX circuit 500 switches between a bit position 4 and a bit position 5, then the only control signal that is changing is the control code on the MUX 502, and the control code on the MUX 520 stays the same since the MUX 520 reads from the same MUX 502 in the two consecutive reads. Therefore, only one MUX is changing in between the bit positions 4 and 5. However, in such a configuration, if the MUX circuit 500 switches between bit positions 8 and 9 (i.e., a crossover point between the MUXes 502 and 504), the control signals not only change on the input MUXes, but also on the output MUX 520, since the MUX 520 now selects the output from the second MUX 504. Thus, the process of changing from the bit positions 8 and 9 results in two changes rather than one change as in the case of switching from the bit positions 4 and 5. Therefore, such a configuration is not desirable.

Instead, according to a preferred embodiment, the delay line taps are wrapped around the eight MUXes 502–516 so that the control code changes only once during any bit position read. The delay line taps are connected to the MUXes in such a way so that the bit position 1 is connected to the first input of the MUX 502, the bit position 2 is connected to the first input of the MUX 504, the bit position 3 is connected to the first input of the MUX 506, and so on until the bit position 8 is connected to the first input of the MUX 516. According to this embodiment, the next bit position, i.e., the bit position 9, is also connected to the MUX 516. Specifically, the bit position 9 is connected to the second input of the MUX 516. Similarly, going up the line of MUXes, the bit positions 10, 11, 12, 13, 14, and 15 are connected to the second inputs of the MUXes 514, 512, 510, 508, 506, and 504. Similarly to the bit positions 8 and 9 being connected to the same MUX 516, the bit positions 16 and 17 are connected to the MUX 502. In such a setup, eight inputs to the MUX 502 are bit positions 1, 16, 17, 32, 33, 48, 49, and 64.

Using the MUX setup described in the preceding paragraph, when the circuit 500 switches between bit positions 1 through 8, none of the control signals on the MUXes 502–516 are changing, and only the control signal on the output MUX 520 is changing to select a different MUX for each consecutive output. When the circuit crosses from the bit position 8 to the bit position 9, the control signals to the MUXes 502–516 are changing, but the control signal on the MUX 520 remains the same since the bit position 8 and the bit position 9 are read from the same MUX 516. As the count increases from the bit position 3 to the bit position 16, the MUX 520 moves up the line from the MUX 516 towards the MUX 502 by changing the control signal being input to the MUX 520. In all cases, only one MUX changes in between any two consecutive positions.

As mentioned earlier, the MUXes 502–516 are driven by three most significant bits of the control signal (i.e., CONTROL <5:3>), and the three bits are decoded into one of eight values, and the decoded value selects which input is passed to the MUX's output. For example, if the three bits are "010", then the second input is passed to the output. Similarly, the output MUX 520 is driven by three least significant bits, i.e., CONTROL <2:0>, and a control signal <3>. The extra control signal is used to invert the three least significant bits. If the control signal is low, no inversion is done, and bits "010" in CONTROL <2:0> indicate that the second input of the MUX 520 drives the MUX_OUT. If the control signal is high, then the bits "010" are inverted to "101", and the fifth input is now selected. In such an embodiment, the control code "000111" selects the eighth delay line position, and the control word "001000" selects the ninth bit position.

Figure 14:
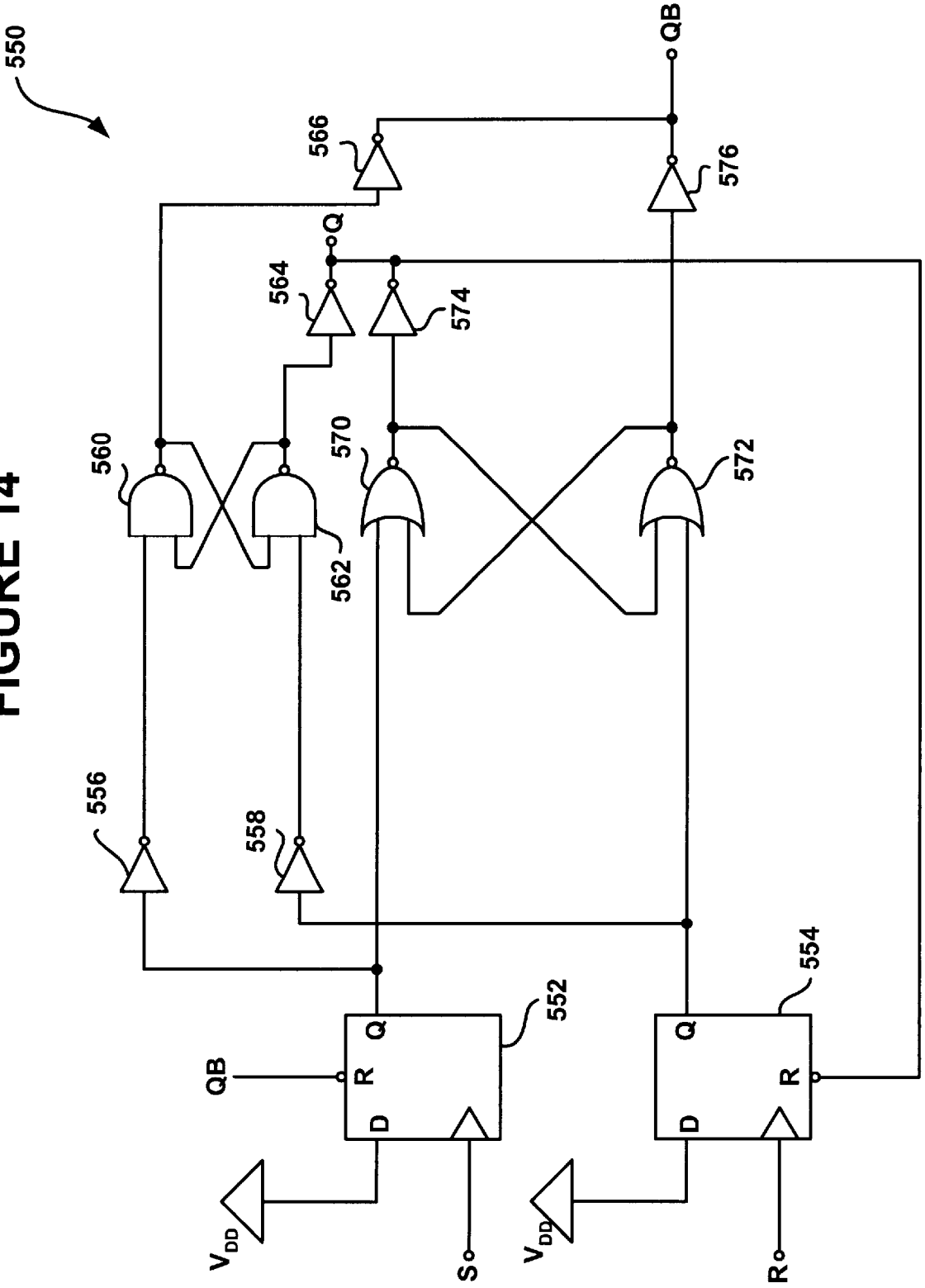
FIG. 14 is a logic circuit diagram illustrating an embodiment of a RS flip-flop suitable for use in the described embodiments.

FIG. 14 is a logic circuit diagram illustrating an embodiment of an edge-triggered RS latch 550 suitable for use in the embodiments, e.g. as SR latch 130 of FIG. 1 and FIG. 7. The SR latch illustrated in FIG. 14 has a transition delay of a set signal (S) to an output signal (Q) that is equal to a signal transition from a reset signal (R) to the Q signal.

In the SR latch 550, a D flip-flop 552 is clocked by a signal received at the S input, which then clocks a logical one from VDD to output Q of the flip-flop 552. The output Q of the flip-flop 552 is coupled to an input of a NOR gate 570 and further through an inverter 556 to an input of a NAND gate 560. Similarly, a D flip-flop 554 is clocked by a signal received at the R input, which then clocks a logical one from VDD to an output Q of the flip-flop 554. An output Q of the flip-flop 554 is coupled to an input of a NOR gate 572 and through an inverter 558 to an input of a NAND gate 562. The NAND gates 560 and 562 are cross-coupled such that the output of each is input to the other. Likewise, the NOR gates 570 and 572 are cross-coupled such that the output of each is input to the other. The output of the NAND gate 560 drives an inverter 566 that, in turn, drives an output QB. The output of the NAND gate 562 drives an inverter 564 that, in turn, drives an output Q. Similarly, the output of the NOR gate 570 drives an inverter 574 that, in turn, drives the output Q. The output of the NOR gate 572 drives an inverter 576 that, in turn, drives the output QB. The Q output drives an inverted reset input of the D flip-flop 554 and the QB output drives an inverted reset input of a D flip-flop 552. The NAND gates 560 and 562 and the NOR gates 570 and 572 preserve the state of the outputs Q and QB of the RS latch 550, which are determined by the signals input to the S and R inputs.

The wired OR produced by the coupling of the outputs of the inverters 564 and 574 and the interpolator such as the wired or produced by the coupling of the outputs of the inverters 566 and 576 accommodates the one gate delay difference introduced by the inverters 556 and 558. The number of gate delays from each of the S and R inputs to outputs Q and QB is approximately the same, which reduces the possibility of a race condition arising from signals arriving at different points of the circuit at different times.

The foregoing circuit may be readily implemented by those skilled in the art of digital circuit design, and the embodiments described are not intended to be limited to any particular process or fabrication techniques. For instance, a conventional synthesized logic design flow may be used. It should be understood that the present invention is not limited to the circuits, methods and systems described herein. Equivalent circuits will become apparent to those skilled in the art of circuit design upon review of the foregoing. The performance of various types of circuits and systems may be improved through the application of the teachings described herein.

In view of the wide variety of embodiments to which the principles of the present invention can be applied, it should be understood that the illustrated embodiments are examples only, and should not be taken as limiting the scope of the present invention. For example, the circuits may employ different types of transistors and amplifiers to obtain the functions described above and the functions may be achieved with more or fewer elements that those illustrated above. Further, some elements of the embodiments described may be implemented in software, hardware, firmware, or a combination of these approaches. Further, it will be apparent to those of ordinary skill in the art that the teachings of the present invention may be applied to other systems besides RAMBUS based data busses.

The claims should not be read as limited to the described order or elements unless stated to that effect. Therefore, all embodiments that come within the scope and spirit of the following claims and equivalents thereto are claimed as the invention.

What is claimed is:

1. A circuit for selectively delaying a reference clock signal, comprising:
   a phase splitter having a first output and a second output;
   a first delay line having a set of output taps, the first delay line being coupled to the first output;
   a second delay line having a set of output taps, the second delay line being coupled to the second output;
   a first multiplexor coupled to the set of output taps from the first delay line, the first multiplexor providing an output that is coupled to a first storage device;
   a second multiplexor coupled to the set of output taps from the second delay line, the second multiplexor providing an output that is coupled to the first storage device; and
   means for comparing an output of the first storage device to an input clock signal and generating a first control signal.

2. A circuit of claim 1, wherein the first control signal is coupled to at least one of the first multiplexor and the second multiplexor.

3. A circuit of claim 1, wherein the comparing means comprises a first phase detector.

4. A circuit of claim 3, wherein the comparing means further comprises a controller coupled to the first phase detector.

5. A circuit of claim 4, wherein the controller generates control signals that are coupled to the first multiplexor and the second multiplexor.

6. A circuit of claim 5, wherein the control signals cause the first multiplexor and the second multiplexor to select an output tap from the respective sets of output taps.

7. A circuit of claim 1, further comprising:
   a third multiplexor coupled to the set of output taps from the first delay line, the third multiplexor providing an output that is coupled to a first interpolator circuit;
   a fourth multiplexor coupled to the set of output taps from the second delay line, the fourth multiplexor providing an output that is coupled to the first interpolator circuit;
   a fifth multiplexor coupled to the set of output taps from the first delay line, the fifth multiplexor providing an output that is coupled to a second interpolator circuit;
   a sixth multiplexor coupled to the set of output taps from the second delay line, the sixth multiplexor providing an output that is coupled to the second interpolator circuit;
   the first interpolator providing an output that is coupled to a second storage device;
   the second interpolator providing an output that is coupled to the second the second storage device;
   the second storage device providing an output that provides a quadrature output clock signal; and
   a quadrature control circuit for generating control signals that are coupled to the third multiplexor, the fourth multiplexor, the fifth multiplexor, and the sixth multiplexor.

8. A circuit of claim 7, wherein the control signals generated at the quadrature control circuit cause the third multiplexor, the fourth multiplexor, the fifth multiplexor, and the sixth multiplexor to select an output tap from the respective sets of output taps.

9. A circuit of claim 7, further comprising a phase detector being coupled to the output of the third multiplexor and the output of the fourth multiplexor, the phase detector providing an output that is coupled to the quadrature control circuit.

10. A circuit of claim 9, wherein the quadrature control circuit is further coupled to the first control signal.

11. A circuit of claim 1, wherein the first delay line includes a power control input for receiving a power control signal, wherein the first delay line is further configured to power down selected elements of the first delay line responsive to the power control signal;
   the second delay line further includes a power control input for receiving the power control signal, wherein the second delay line is further configured to power down selected elements of the second delay line responsive to the power control signal; and
   the control circuit includes a power control output for generating the power control signal, wherein the control circuit is further configured to generate the power control signal based upon the first control signal such that unnecessary delay elements in the first and second delay line are disabled.

12. A circuit of claim 11, further comprising means for detecting a cycle boundary, of the reference clock signal and for generating a cycle boundary signal.

13. A circuit of claim 12, wherein the cycle boundary signal is coupled to means for generating the first control signal and the power control signal.

14. A circuit of claim 1, wherein each multiplexor comprises a plurality of first level multiplexors coupled to respective output taps, wherein each first level multiplexor generates an output coupled to a second level multiplexor, wherein each first level multiplexor includes a control input for receiving a first control word derived from the first control signal, wherein the second level multiplexor includes a control input for receiving a second control word derived from the first control signal, and wherein the plurality of first level multiplexors are connected to the respective sets of output taps such that only one of the first control word and the second control word is changing between switching from one output tap position to a next output tap position.

15. The circuit of claim 14, wherein the output taps comprise at least a first plurality of output taps and a second plurality of output taps, and wherein each consecutive tap of the first plurality of output taps is connected to first inputs of each consecutive multiplexor of the plurality of first level multiplexors starting with a first multiplexor until the last multiplexor is reached, and wherein each consecutive tap of the second plurality of output taps is connected to second inputs of each consecutive multiplexor starting with the last multiplexor of the plurality of first level multiplexor until the first multiplexor is reached.

16. A circuit for selectively delaying a reference clock signal, the circuit comprising:

a phase splitter for receiving a reference clock signal and outputting an in-phase reference signal and a complementary reference signal, where the complementary reference signal is complementary to the in-phase reference signal;

a first delay line having an input for receiving the in-phase reference signal and a set of output taps for outputting the in-phase reference signal with successively increasing delay;

a first multiplexor (MUX) having a plurality of inputs, each one of the plurality of inputs being coupled to a corresponding one of the set of output taps of the first delay line, the first MUX having a control input for receiving a first control signal for selecting one of the plurality of inputs for coupling to an output of the first MUX;

a second delay line having an input for receiving the complementary reference signal and a set of output taps for outputting the complementary reference signal with successively increasing delay;

a second MUX having a plurality of inputs, each one of the plurality of inputs being coupled to a corresponding one of the set of output taps of the second delay line, the second MUX having a control input for receiving the first control signal for selecting one of the plurality of inputs for coupling to an output of the second MUX;

a first latch having a set input coupled to the output of the first MUX, a reset input coupled to the output of the second MUX, and an output for producing an output clock signal;

a phase detector having a first input for receiving a feedback clock signal corresponding to the output clock signal, a second input for receiving an input clock signal, where the phase detector is configured to output a difference signal at an output of the phase detector that indicates a phase relationship between the feedback clock signal and the input clock signal; and a controller having an input for receiving the difference signal and an output for generating the first control signal, where the controller is configured to adjust the control signal responsive to the difference signal so as to align the feedback clock signal and the input clock signal.

17. The circuit of claim 16, the circuit further comprising:

a third MUX having a plurality of inputs, each one of the plurality of inputs being coupled to a corresponding one of the set of output taps of the first delay line, the third MUX having a control input for receiving a second control signal for selecting one of the plurality of inputs for coupling to an output of the third MUX, wherein the third MUX outputs a delayed version of the selected input from the first delay line;

a fourth MUX having a plurality of inputs, each one of the plurality of inputs being coupled to a corresponding one of the set of output taps of the second delay line, the fourth MUX having a control input for receiving a third control signal for selecting one of the plurality of inputs for coupling to an output of the fourth MUX, wherein the fourth MUX outputs an advanced version of the selected input from the second delay line;

a first interpolator circuit having a first input coupled to the output of the third MUX, and having a second input coupled to the output of the fourth MNUX, and an output for generating a first quadrature signal;

a fifth MUX having a plurality of inputs, each one of the plurality of inputs being coupled to a corresponding one of the set of output taps of the first delay line, the fifth MUX having a control input for receiving a fourth control signal for selecting one of the plurality of inputs for coupling to an output of the fifth MUX, wherein the fifth MUX outputs an advanced version of the selected input from the first delay line;

a sixth MUX having a plurality of inputs, each one of the plurality of inputs being coupled to a corresponding one of the set of output taps of the second delay line, the sixth MUX having a control input for receiving a fifth control signal for selecting one of the plurality of inputs for coupling to an output of the sixth MUX, wherein the sixth MUX outputs a delayed version of the selected input from the second delay line;

a second interpolator circuit having a first input coupled to the output of the fifth MUX, a second input coupled to the output of the sixth MUX, and an output for generating a second quadrature signal;

a second latch having a set input coupled to the output of the first interpolator, a reset input coupled to the output of the second interpolator, and an output for producing a quadrature output clock signal;

a first flip-flop having a data input coupled to the output of the fourth MUX, a clock input coupled to the output of the third MUX, and a data output for generating a first test signal; and a quadrature control circuit having a first input for receiving the first control signal, a second input coupled to the data output of the first flip-flop, a first output for generating the second control signal, a second output for generating the third control signal, a third output for generating the fourth control signal, and a fourth output for generating a fifth control signal, where the quadrature control circuit generates the second control signal and the fifth control signal by offsetting the first control signal by a selected offset value in a first direction relative to the magnitude of the first control signal and generates the third control signal and the fourth control signal by offsetting the first control signal by the selected offset value in a second direction that is opposite to the first direction, where the selected offset value is selected by starting with a first value and successively changing the selected offset value until the test signal changes value.

18. The circuit of claim 17, where the quadrature control circuit is further configured to start with a first minimum value for the offset value, and successively increment the selected offset value until the test signal changes value and then decrement the selected offset value.

19. The circuit of claim 17, where the quadrature control circuit is further configured to start with a maximum value for the offset value and successively decrement the selected offset value until the test signal changes value.

20. The circuit of claim 17, where the quadrature control circuit is integrated with the control circuit.

21. The circuit of claim 17, where the first interpolator circuit further comprises:

a first inverter having an input coupled to the output of the third MUX and an output;

a second inverter having an input coupled to the output of the fourth MUX and an output; and a third inverter having an input coupled to the outputs of the first and second inverters and an output for generating the first quadrature signal, where the third inverter is a relatively larger device than first and second inverter devices, and wherein the first quadrature signal is a 90-degree signal relative to the output clock signal.

22. The circuit of claim 17, wherein the second interpolator circuit further comprises:

a fourth inverter having an input coupled to the output of the fifth MUX and an output;

a fifth inverter having an input coupled to the output of the sixth MUX and an output; and a sixth inverter having an input coupled to the outputs of the fourth and fifth inverters and an output for generating the second quadrature signal, where the sixth inverter is a relatively larger device than the fourth and fifth inverter devices, and wherein the second quadrature signal is 270-degree signal relative to the output clock signal.

23. The circuit of claim 16, wherein:

the first delay line further includes a power control input for receiving a power control signal, where the first delay line is further configured to power down selected elements of the first delay line responsive to the power control signal;

the second delay line further includes a power control input for receiving the power control signal, where the second delay line is further configured to power down selected elements of the second delay line responsive to the power control signal; and the control circuit includes a power control output for generating the power control signal, where the control circuit is further configured to generate the power control signal based upon the first control signal such that unnecessary delay elements in the first and second delay lines are disabled.

24. The circuit of claim 16, where the reference clock signal and input clock signal are both configured to have a 50% duty cycle.

25. The circuit of claim 16, further comprising means for detecting a cycle boundary of the reference clock signal and for generating a cycle boundary signal.

26. The circuit of claim 25, wherein the cycle boundary signal is coupled to the controller generating the first control signal, and wherein the controller uses the cycle boundary signal to adjust the first control signal.

27. The circuit of claim 16, wherein each MUX comprises a plurality of first level multiplexors coupled to respective output taps, wherein each first level multiplexor generates an output coupled to a second level multiplexor, wherein each first level multiplexor includes a control input for receiving a first control word derived from the control signal, wherein the second level multiplexor includes a control input for receiving a second control word derived from the control signal, and wherein the first level of multiplexors are connected to the respective sets of output taps such that only one of the first control word and the second control word is changing between switching from one output tap position to a next output tap position.

28. A method for recovering a clock signal from an input clock signal, comprising the steps of:

converting a reference clock signal into an in-phase reference signal and a complementary reference signal;

delaying the in-phase reference signal and the complementary reference signal;

generating an output clock signal from the delayed in-phase reference signal and the complementary reference signal;

comparing a feedback signal representing the output clock signal to the input clock signal to generate a first control signal; and adjusting a length of delay for at least one of the in-phase reference signal and the complementary reference signal based upon the control signal.

29. The method of claim 28, further comprising:

comparing the delayed in-phase reference signal and the delayed complementary reference clock signal to generate a test signal;

generating a set of quadrature control signals using the test signal and the first control signal;

selecting the delayed in-phase reference signal and the delayed complementary reference clock signal based on the set of quadrature control signals to generate a first set of signals and a second set of signals;

interpolating between the first set signal to generate a first quadrature signal;

interpolating between the second set of signals to generate a second quadrature signal; and generating a quadrature clock signal using the first quadrature signal and the second quadrature signal.

30. The method of claim 28, wherein delaying the in-phase reference signal and the complementary reference signal comprises delaying the in-phase reference signal and the complementary reference signal via at least two delay lines, and wherein the method further comprises:

generating a power control signal for powering down selected elements of the at least two delay lines.

31. The method of claim 30, further comprising:

generating a cycle boundary signal for adjusting the power control signal and the control signal.

32. A method for recovering a clock signal from an input clock signal, the method comprising the steps of:

converting a reference clock signal into an in-phase reference signal and a complementary reference signal;

successively delaying the in-phase reference clock signal to produce a series of delayed in-phase reference clock signals;

successively delaying the complementary reference clock signal to produce a series of delayed complementary reference clock signals;

selecting a first one of the series of delayed in-phase reference clock signals and a first one of the series of delayed complementary reference clock signals responsive to a first control signal, where the first one of the series of delayed complementary reference clock signals corresponds to the first one of the series of delayed in-phase reference clock signals;

generating an output clock signal by producing a rising edge in the output clock signal responsive to a rising edge in the first one of the series of delayed in-phase reference clock signals and producing a falling edge in the output clock signal responsive to a rising edge in the first one of the series of delayed complementary reference clock signals;

receiving the input clock signal;

comparing the input clock signal to a feedback clock signal related to the output clock signal to produce a difference signal; and generating the first control signal responsive to the difference signal in order to bring the feedback clock signal into phase with the input clock signal.

33. The method of claim 32, further comprising generating the reference clock signal to have a correct duty cycle.

34. The method of claim 32, the method further comprising the steps of:
- selecting a second one of the series of delayed in-phase reference clock signals responsive to a second control signal;
- selecting a second one of the series of delayed complementary reference clock signals responsive to a third control signal;
- selecting a third one of the series of delayed in-phase reference clock signals responsive to a fourth control signal;
- selecting a fourth one of the series of delayed complementary reference clock signals responsive to a fifth control signal;
- sensing a phase relationship between the second one of the series of delayed in-phase reference clock signals and the second one of the series of delayed complementary reference clock signals to produce a test signal;
- generating the second, third, fourth and fifth control signals based upon the first control signal and adjusting the second, third, fourth, and fifth control signals until a state change is detected in the test signal;
- interpolating between the second one of the series of delayed in-phase reference clock signals and the second one of the series of delayed complementary reference clock signals to produce a first quadrature signal;
- interpolating between the third one of the series of delayed in-phase reference clock signals and the third one of the series of delayed complementary reference clock signals to produce a second quadrature signal; and
- generating a quadrature output clock signal using the first quadrature signal and the second quadrature signal.

35. The method of claim 34, where the step of generating the second, third, fourth, and fifth control signals based upon the first control signal and adjusting the second, third, fourth, and fifth control signals until a state change is detected in the test signal further comprises the steps of:
- generating the second control signal by offsetting the first control signal value by an offset value in a first direction relative to the magnitude of the first control signal;
- generating the third control signal by offsetting the first control signal value by the offset value in a second direction relative to the magnitude of the first control signal;
- selecting a first value for the offset value; and
- successively changing the offset value until the state change is detected in the test signal.

36. The method of claim 35, where:
- the step of selecting a first value for the offset value further comprises selecting a minimum value for the offset value; and
- the step of successively changing the offset value until the state change is detected in the test signal further comprises successively incrementing the offset value until the state change is detected in the test signal and then decrementing the offset value.

37. The method of claim 35, where:
- the step of selecting a first value for the offset value further comprises selecting a maximum value for the offset value; and
- the step of successively changing the offset value until the state change is detected in the test signal further comprises successively decrementing the offset value until the state change is detected in the test signal.

38. The method of claim 34, where the step of interpolating between the second one of the series of delayed in-phase reference clock signals and the second one of the series of delayed complementary reference clock signals to produce a first quadrature signal further comprises the steps of:
- driving an input of a first large driver device with a first small driver device responsive to the second one of the series of delayed in-phase reference clock signals; and
- driving the input of the first large driver device with a second small driver device responsive to the second one of the series of delayed complementary reference clock signals.

39. The method of claim 34, wherein the step of interpolating between the third one of the series of the delayed in-phase reference clock signal and the third one of the series of delayed complementary reference clock signals to produce a second quadrature signal further comprises the steps of:
- driving an input of a second larger driver device with a third small driver device responsive to the third one of the series of delayed in-phase reference clock signals; and
- driving the input of the second larger driver device with a fourth small driver device responsive to the third one of the series of delayed complementary reference clock signals.

40. The method of claim 34, where the step of sensing a phase relationship between the second one of the series of delayed in-phase reference clock signals and the second one of the series of delayed complementary reference clock signals responsive to a third control signal to produce a test signal further comprises clocking the second one of the series of delayed complementary reference clock signals with the second one of the series of delayed in-phase reference clock signals to obtain the test signal.

41. The method of claim 35, where:
- the step of successively delaying the in-phase reference clock signal to produce a series of delayed in-phase reference clock signals further comprises delaying the in-phase reference signal with a first series of delay elements to produce the series of delayed in-phase reference clock signals;
- the step of successively delaying the complementary reference clock signal to produce a series of delayed complementary reference clock signals further comprises delaying the complementary reference clock signal with a second series of delay elements to produce the series of delayed complementary reference clock signals; and
- the method includes the step of disabling unused ones of the first and second series of delay elements.

42. The method of claim 32, where the step of generating a reference clock signal having a correct duty cycle further comprises generating the reference clock signal with a 50% duty cycle.

43. An apparatus for recovering an input clock signal, the apparatus comprising:
- means for generating a reference clock signal having a correct duty cycle;
- means for converting the reference clock signal into an in-phase reference signal and a complementary reference signal;
- means for successively delaying the in-phase reference clock signal to produce a series of delayed in-phase reference clock signals;

means for successively delaying the complementary reference clock signal to produce a series of delayed complementary reference clock signals;

means for selecting a first one of the series of delayed in-phase reference clock signals and a first one of the series of delayed complementary reference clock signals responsive to a first control signal, where the first one of the series of delayed complementary reference clock signals corresponds to the first one of the series of delayed in-phase reference clock signals;

means for generating an output clock signal by producing a rising edge in the output clock signal responsive to a rising edge in the first one of the series of delayed in-phase reference clock signals and producing a falling edge in the output clock signal responsive to a rising edge in the first one of the series of delayed complementary reference clock signals;

means for receiving the input clock signal;

means for comparing the input clock signal to a feedback clock signal related to the output clock signal to produce a difference signal; and means for generating the first control signal responsive to the difference signal in order to bring the feedback clock signal into phase with the input clock signal.

44. The apparatus of claims 43, the apparatus further including:

means for selecting a second one of the series of delayed in-phase reference clock signals responsive to a second control signal;

means for selecting a second one of the series of delayed complementary reference clock signals responsive to a third control signal;

means for sensing a phase relationship between the second one of the series of delayed in-phase reference clock signals and the second one of the series of delayed complementary reference clock signals responsive to the first control signal to produce a test signal;

means for selecting a third one of the series of delayed in-phase reference clock signals responsive to a fourth control signal;

means for selecting a third one of the series of delayed complementary reference clock signals responsive to a fifth control signal;

means for generating the second, third, fourth and fifth control signals based upon the first control signal and adjusting the second and third control signals until a state change is detected in the test signal;

means for interpolating between the second one of the series of delayed in-phase reference clock signals and the second one of the series of delayed complementary reference clock signals to produce a first quadrature signal;

means for interpolating between the third one of the series of delayed in-phase references clock signals and the third one of the series of delayed complementary reference clock signals to produce a second quadrature signal; and means for producing a quadrature output clock signal using the first quadrature signal and the second quadrature signal.

45. The apparatus of claim 44, where the means for generating the second, third, fourth, and fifth control signals based upon the first control signal and adjusting the second and third control signals until a state change is detected in the test signal further comprises:

means for generating the second control signal and the fifth control signal by offsetting the first control signal value by an offset value in a first direction relative to the magnitude of the first control signal;

means for generating the third control signal and the fourth control signal by offsetting the first control signal value by the offset value in a second direction relative to the magnitude of the first control signal;

means for selecting a first value for the offset value; and means for successively changing the offset value until the state change is detected in the test signal.

46. The apparatus of claim 45, where:

the means for selecting a first value for the offset value further comprises means selecting a minimum value for the offset value; and the means for successively changing the offset value until the state change is detected in the test signal further comprises means for successively incrementing the offset value until the state change is detected in the test signal and then decrementing the offset value; and the step of selecting a first value for the offset value further comprises selecting a maximum value for the offset value; and the step of successively changing the offset value until the state change is detected in the test signal further comprises successively decrementing the offset value until the state change is detected in the test signal.

47. The apparatus of claim 44, where the means for interpolating between the second one of the series of delayed in-phase reference clock signals and the second one of the series of delayed complementary reference clock signals to produce a first quadrature signal further comprises:

means for driving an input of a first large driver device with a first small driver device responsive to the second one of the series of delayed in-phase reference clock signals; and means for driving the input of the first large driver device with a second small driver device responsive to the second one of the series of delayed complementary reference clock signals.

48. The apparatus of claim 44, where the means for interpolating between the third one of the series of delayed in-phase references clock signals and the third one of the series of delayed complementary reference clock signals to produce a second quadrature signal further comprises:

means for driving an input of a second large driver device with a third small driver device responsive to the third one of the series of delayed in-phase reference clock signals; and means for driving the input of the second larger driver device with a fourth small driver device responsive to the third one of the series of delayed complementary reference clock signals.

49. The apparatus of claim 44, where the means for sensing a phase relationship between the second one of the series of delayed in-phase reference clock signals and the second one of the series of delayed complementary reference clock signals responsive to a third control signal to produce a test signal further comprises means for clocking the second one of the series of delayed complementary reference clock signals with the second one of the series of delayed in-phase reference clock signals to obtain the test signal.

50. The apparatus of claim 43, where:

the means for successively delaying the in-phase reference clock signal to produce a series of delayed in-phase reference clock signals further comprises means for delaying the in-phase reference signal with a first series of delay elements to produce the series of delayed in-phase reference clock signals;

the means for successively delaying the complementary reference clock signal to produce a series of delayed complementary reference clock signals further comprises means for delaying the complementary reference clock signal with a second series of delay elements to produce the series of delayed complementary reference clock signals; and the apparatus includes means for disabling unused ones of the first and second series of delay elements.

51. The apparatus of claim 43, where the means for generating a reference clock signal having a correct duty cycle further comprises means for generating the reference clock signal with a 50% duty cycle.

52. The apparatus of claim 43, further comprising means for detecting a cycle boundary of the reference clock signal to generate a cycle boundary signal.

* * * * *

UNITED STATES PATENT AND TRADEMARK OFFICE
CERTIFICATE OF CORRECTION

PATENT NO. : 6,642,760 B1  
DATED : November 4, 2003  
INVENTOR(S) : Alon et al.

It is certified that error appears in the above-identified patent and that said Letters Patent is hereby corrected as shown below:

Column 14,
Line 4, please delete (second occurrence) "the second."

Column 16,
Line 3, please correct "MNUX" to -- MUX. --

Signed and Sealed this

Eleventh Day of May, 2004

JON W. DUDAS  
*Acting Director of the United States Patent and Trademark Office*